US012652947B2

(12) United States Patent
Li

(10) Patent No.: US 12,652,947 B2
(45) Date of Patent: Jun. 9, 2026

(54) SINGLE-WALLED CARBON NANOTUBE FILMS AND METHOD AND APPARATUS FOR FABRICATING THEREOF

(71) Applicant: Atom H2O, LLC, Escondido, CA (US)

(72) Inventor: Huaping Li, Los Angeles, CA (US)

(73) Assignee: Atom H2O, LLC, Escondido, CA (US)

( * ) Notice: Subject to any disclaimer, the term of this patent is extended or adjusted under 35 U.S.C. 154(b) by 902 days.

(21) Appl. No.: 17/756,895

(22) PCT Filed: Dec. 4, 2020

(86) PCT No.: PCT/US2020/063455
§ 371 (c)(1),
(2) Date: Jun. 3, 2022

(87) PCT Pub. No.: WO2021/113742
PCT Pub. Date: Jun. 10, 2021

(65) Prior Publication Data
US 2023/0227313 A1 Jul. 20, 2023

Related U.S. Application Data

(60) Provisional application No. 62/944,241, filed on Dec. 5, 2019.

(51) Int. Cl.
*H10K 85/20* (2023.01)
*B01J 19/00* (2006.01)
(Continued)

(52) U.S. Cl.
CPC ........ *H10K 85/221* (2023.02); *B01J 19/0013* (2013.01); *B82Y 40/00* (2013.01);
(Continued)

(58) Field of Classification Search
CPC ... H10K 85/221; H10K 50/81; B01J 19/0013; B01J 2219/00121; B82Y 40/00; C01B 32/159; C01B 32/162; C01B 2202/02
See application file for complete search history.

(56) References Cited

U.S. PATENT DOCUMENTS 4,802,982 A    2/1989 Lien
5,180,690 A    1/1993 Czubatyj et al.
(Continued)

FOREIGN PATENT DOCUMENTS

CA    2660069 A1    9/2010
CN    101913591 A    12/2010
(Continued)

OTHER PUBLICATIONS

Wang, et al., Continuous Fabrication of Meter-Scale Single-Wallk Carbon Nanotube Films and their Use in Flexible and Transparent Integrated Circuits, Adv. Mater. 2018; 1802057: pp. 1-8, with Supporting Information (Year: 2018).*
(Continued)

*Primary Examiner* — Daniel C. Mccracken
(74) *Attorney, Agent, or Firm* — KPPB LLP

(57) ABSTRACT

Disclosed herein is an apparatus and method for fabrication of large diameter single-walled carbon nanotube films. Advantageously, large diameter single-walled carbon nanotube films may be useful as transparent electrodes with high transparency and lower sheet resistance. In one embodiment, the method includes supplying carrier carbon monoxide and catalyst precursor through a first inlet at a temperature below the reaction temperature of the catalyst precursor; supplying heated carbon monoxide through a second inlet such that the heated carbon monoxide mixes with the carrier carbon monoxide and the catalyst an aerosol; reacting the aerosol in a reaction chamber to form a composite aerosol of single walled carbon nanotubes, metal nanoparticles, carbon mon-
(Continued)

oxide, and carbon dioxide. In this embodiment, the heated carbon monoxide heats the catalyst precursor which reacts with the carbon monoxide to form carbon nanotubes.

14 Claims, 7 Drawing Sheets

(51) Int. Cl.
| | |
|---|---|
| *B82Y 40/00* | (2011.01) |
| *C01B 32/159* | (2017.01) |
| *C01B 32/162* | (2017.01) |
| *H10K 50/81* | (2023.01) |

(52) U.S. Cl.
CPC .......... *C01B 32/159* (2017.08); *C01B 32/162* (2017.08); *B01J 2219/00121* (2013.01); *C01B 2202/02* (2013.01); *H10K 50/81* (2023.02)

(56) References Cited

U.S. PATENT DOCUMENTS

| | | | |
|---|---|---|---|
| 5,211,822 | A | 5/1993 | Alary et al. |
| 5,789,766 | A | 8/1998 | Huang et al. |
| 6,682,863 | B2 | 1/2004 | Rivers et al. |
| 6,761,870 | B1 * | 7/2004 | Smalley ................ D01F 9/1278 |
| | | | 977/750 |
| 6,890,780 | B2 | 5/2005 | Lee |
| 6,919,681 | B2 | 7/2005 | Cok et al. |
| 7,052,668 | B2 | 5/2006 | Smalley et al. |
| 7,064,372 | B2 | 6/2006 | Duan et al. |
| 7,253,041 | B2 | 8/2007 | Gan et al. |
| 7,381,983 | B2 | 6/2008 | Bae et al. |
| 7,537,975 | B2 | 5/2009 | Moon et al. |
| 7,771,784 | B2 | 8/2010 | Loutfy et al. |
| 7,786,466 | B2 | 8/2010 | Appenzeller et al. |
| 7,907,226 | B2 | 3/2011 | Yang et al. |
| 7,932,511 | B2 | 4/2011 | Duan et al. |
| 7,993,524 | B2 | 8/2011 | Ratto et al. |
| 8,058,663 | B2 | 11/2011 | Fan et al. |
| 8,119,091 | B2 | 2/2012 | Keith et al. |
| 8,125,824 | B1 | 2/2012 | Ward et al. |
| 8,232,561 | B2 | 7/2012 | Rinzler et al. |
| 8,246,928 | B1 | 8/2012 | Rao et al. |
| 8,470,946 | B1 | 6/2013 | Carlson |
| 8,512,668 | B2 | 8/2013 | Tanaka et al. |
| 8,562,905 | B2 | 10/2013 | Hersam et al. |
| 8,642,363 | B2 | 2/2014 | Lau et al. |
| 8,715,607 | B2 | 5/2014 | Liu et al. |
| 8,860,137 | B2 | 10/2014 | Zhou et al. |
| 8,940,562 | B1 | 1/2015 | Li |
| 9,070,775 | B2 | 6/2015 | Chaji et al. |
| 9,214,644 | B2 | 12/2015 | Rinzler et al. |
| 9,379,166 | B2 | 6/2016 | Li et al. |
| 9,445,421 | B2 | 9/2016 | Levine et al. |
| 9,455,421 | B2 | 9/2016 | Li |
| 9,487,002 | B2 | 11/2016 | Rogers et al. |
| 9,637,382 | B2 | 5/2017 | Noyes |
| 9,675,937 | B2 | 6/2017 | Dontula et al. |
| 9,748,439 | B2 | 8/2017 | Li et al. |
| 9,824,789 | B2 | 11/2017 | Pei et al. |
| 10,144,647 | B2 | 12/2018 | Zhou et al. |
| 10,418,595 | B2 | 9/2019 | Li |
| 10,497,888 | B2 | 12/2019 | Kleemann et al. |
| 10,541,374 | B2 | 1/2020 | Li |
| 10,665,796 | B2 | 5/2020 | Li |
| 10,847,757 | B2 | 11/2020 | Li |
| 10,957,868 | B2 | 3/2021 | Luan et al. |
| 10,978,640 | B2 | 4/2021 | Li |
| 11,069,867 | B2 | 7/2021 | Li |
| 11,177,465 | B2 | 11/2021 | Li |
| 12,150,373 | B2 | 11/2024 | Li |
| 2003/0214465 | A1 | 11/2003 | Kimura |
| 2004/0013598 | A1 | 1/2004 | McElrath et al. |
| 2004/0135951 | A1 | 7/2004 | Stumbo et al. |

| | | | |
|---|---|---|---|
| 2004/0223901 | A1 | 11/2004 | Smalley et al. |
| 2004/0252113 | A1 | 12/2004 | Vicentini et al. |
| 2004/0263069 | A1 | 12/2004 | Yamazaki et al. |
| 2005/0012686 | A1 | 1/2005 | Osame et al. |
| 2005/0221016 | A1 | 10/2005 | Glatkowski et al. |
| 2006/0063460 | A1 | 3/2006 | Seo |
| 2006/0081844 | A1 | 4/2006 | Hirosue et al. |
| 2006/0110862 | A1 | 5/2006 | Gan et al. |
| 2006/0115640 | A1 | 6/2006 | Yodh et al. |
| 2006/0145144 | A1 | 7/2006 | Lee et al. |
| 2006/0183278 | A1 | 8/2006 | Bertin et al. |
| 2006/0261433 | A1 | 11/2006 | Manohara et al. |
| 2007/0026646 | A1 | 2/2007 | Chae |
| 2007/0075627 | A1 | 4/2007 | Kimura et al. |
| 2007/0108480 | A1 | 5/2007 | Nanai et al. |
| 2007/0148962 | A1 | 6/2007 | Kauppinen et al. |
| 2007/0246784 | A1 | 10/2007 | Kang et al. |
| 2008/0008643 | A1 | 1/2008 | Landi et al. |
| 2008/0023066 | A1 | 1/2008 | Hecht et al. |
| 2008/0116787 | A1 | 5/2008 | Hsu et al. |
| 2008/0143906 | A1 | 6/2008 | Allemand et al. |
| 2008/0149561 | A1 | 6/2008 | Chu et al. |
| 2008/0217588 | A1 | 9/2008 | Arnold et al. |
| 2008/0246407 | A1 | 10/2008 | Yoshida et al. |
| 2008/0286447 | A1 | 11/2008 | Alden et al. |
| 2009/0008634 | A1 | 1/2009 | Tessler et al. |
| 2009/0050879 | A1 | 2/2009 | Yamaga et al. |
| 2009/0224292 | A1 | 9/2009 | Asano et al. |
| 2009/0283771 | A1 | 11/2009 | Jiang et al. |
| 2009/0302324 | A1 | 12/2009 | Jiang et al. |
| 2010/0098904 | A1 | 4/2010 | Dai et al. |
| 2010/0103089 | A1 | 4/2010 | Yoshida et al. |
| 2010/0133516 | A1 | 6/2010 | Lee et al. |
| 2010/0145062 | A1 | 6/2010 | Li et al. |
| 2011/0012125 | A1 | 1/2011 | Nicholas et al. |
| 2011/0036403 | A1 | 2/2011 | Yoon et al. |
| 2011/0045660 | A1 | 2/2011 | Romano et al. |
| 2011/0171531 | A1 | 7/2011 | Hersam et al. |
| 2011/0187798 | A1 | 8/2011 | Rogers et al. |
| 2011/0223095 | A1 | 9/2011 | Harvey et al. |
| 2011/0233512 | A1 | 9/2011 | Yang et al. |
| 2011/0273410 | A1 | 11/2011 | Park et al. |
| 2011/0285951 | A1 | 11/2011 | Yoon et al. |
| 2011/0309378 | A1 | 12/2011 | Lau et al. |
| 2012/0062109 | A1 | 3/2012 | Berry et al. |
| 2012/0080380 | A1 | 4/2012 | Wang et al. |
| 2012/0104328 | A1 | 5/2012 | Park et al. |
| 2012/0141678 | A1 | 6/2012 | Sumerel |
| 2012/0171103 | A1 | 7/2012 | Zhao et al. |
| 2012/0223288 | A1 | 9/2012 | Kim et al. |
| 2012/0248416 | A1 | 10/2012 | Zhou et al. |
| 2012/0256175 | A1 | 10/2012 | Rinzler et al. |
| 2012/0256296 | A1 | 10/2012 | Wei et al. |
| 2012/0280213 | A1 | 11/2012 | Gau et al. |
| 2013/0004798 | A1 | 1/2013 | Huang et al. |
| 2013/0069043 | A1 | 3/2013 | Friend et al. |
| 2013/0105770 | A1 | 5/2013 | Pschenitzka |
| 2013/0108793 | A1 | 5/2013 | Sivarajan et al. |
| 2013/0119345 | A1 | 5/2013 | Park et al. |
| 2013/0119348 | A1 | 5/2013 | Zhou et al. |
| 2013/0126890 | A1 | 5/2013 | Bedell et al. |
| 2013/0181172 | A1 | 7/2013 | Nishi et al. |
| 2013/0240842 | A1 | 9/2013 | Rinzler et al. |
| 2014/0070169 | A1 | 3/2014 | Zhou et al. |
| 2014/0209997 | A1 | 7/2014 | Qian et al. |
| 2014/0217409 | A1 | 8/2014 | Chaji et al. |
| 2014/0273379 | A1 | 9/2014 | Tsai et al. |
| 2014/0273408 | A1 | 9/2014 | Adiga et al. |
| 2015/0060359 | A1 | 3/2015 | Wang et al. |
| 2015/0060364 | A1 | 3/2015 | Mccutcheon et al. |
| 2015/0102288 | A1 | 4/2015 | Hersam et al. |
| 2015/0155430 | A1 | 6/2015 | Li |
| 2015/0202662 | A1 | 7/2015 | Li |
| 2015/0217219 | A1 | 8/2015 | Sinsabaugh et al. |
| 2015/0224450 | A1 | 8/2015 | Jassby et al. |
| 2015/0279919 | A1 | 10/2015 | Zhou et al. |
| 2015/0291429 | A1 | 10/2015 | Ge et al. |
| 2015/0340631 | A1 | 11/2015 | Rinzler et al. |
| 2016/0043152 | A1 | 2/2016 | Tian et al. |

(56) References Cited

U.S. PATENT DOCUMENTS

| | | |
|---|---|---|
| 2016/0126293 A1 | 5/2016 | Li et al. |
| 2016/0137854 A1 | 5/2016 | Heintz et al. |
| 2016/0158707 A1 | 6/2016 | Heijnen et al. |
| 2016/0190170 A1 | 6/2016 | Yamazaki et al. |
| 2016/0280547 A1 | 9/2016 | Liu et al. |
| 2016/0329378 A1 | 11/2016 | Li et al. |
| 2016/0359144 A1 | 12/2016 | Li |
| 2016/0380217 A1 | 12/2016 | Afzali-Ardakani et al. |
| 2017/0194581 A1 | 7/2017 | Li |
| 2017/0213963 A1 | 7/2017 | Cain et al. |
| 2018/0114934 A1 | 4/2018 | Rutherglen et al. |
| 2018/0126337 A1 | 5/2018 | Beavers et al. |
| 2018/0148337 A1 | 5/2018 | Walsh et al. |
| 2018/0261772 A1 | 9/2018 | Arnold et al. |
| 2018/0323387 A1 | 11/2018 | Li |
| 2018/0323388 A1 | 11/2018 | Li |
| 2018/0323406 A1 | 11/2018 | Li |
| 2018/0345228 A1 | 12/2018 | Mcginnis et al. |
| 2018/0358568 A1 | 12/2018 | Luan et al. |
| 2019/0081259 A1 | 3/2019 | Mao |
| 2019/0233296 A1 | 8/2019 | Novek |
| 2019/0275471 A1 | 9/2019 | Xu et al. |
| 2020/0067025 A1 | 2/2020 | Li |
| 2020/0127201 A1 | 4/2020 | Li |
| 2020/0203644 A1 | 6/2020 | Li |
| 2021/0032107 A1 | 2/2021 | Walsh et al. |
| 2021/0167335 A1 | 6/2021 | Li |
| 2022/0077392 A1 | 3/2022 | Li |
| 2023/0347302 A1 | 11/2023 | Li |
| 2025/0160190 A1 | 5/2025 | Li |
| 2025/0222411 A1 | 7/2025 | Li |

FOREIGN PATENT DOCUMENTS

| | | |
|---|---|---|
| CN | 102107854 A | 6/2011 |
| CN | 102634249 A | 8/2012 |
| CN | 102723276 A | 10/2012 |
| CN | 102983176 A | 3/2013 |
| CN | 103236442 A | 8/2013 |
| CN | 103466591 A | 12/2013 |
| CN | 103872085 A | 6/2014 |
| CN | 103972296 A | 8/2014 |
| CN | 104576744 A | 4/2015 |
| CN | 108885967 A | 11/2018 |
| CN | 110892532 A | 3/2020 |
| CN | 111149232 A | 5/2020 |
| CN | 113632254 A | 11/2021 |
| CN | 114982254 A | 8/2022 |
| CN | 108885967 B | 11/2023 |
| CN | 111149232 B | 5/2024 |
| CN | 114982254 B | 10/2025 |
| EP | 4146376 A1 | 3/2023 |
| FR | 1407531 A | 7/1965 |
| GB | 1418519 A | 12/1975 |
| GB | 2562921 A | 11/2018 |
| GB | 2562921 B | 11/2022 |
| GB | 2610050 A | 2/2023 |
| GB | 2610050 B | 7/2023 |
| HK | 40000981 A | 2/2020 |
| HK | 40088793 A | 10/2023 |
| HK | 40088793 B | 1/2024 |
| HK | 40000981 B | 6/2024 |
| JP | 2006108653 A | 4/2006 |
| JP | 2006240898 A | 9/2006 |
| JP | 2007031238 A | 2/2007 |
| JP | 2014150173 A | 8/2014 |
| KR | 1020090100186 A | 9/2009 |
| KR | 20090112626 A | 10/2009 |
| KR | 101250310 B1 | 4/2013 |
| KR | 20140003397 A | 1/2014 |
| KR | 101459502 B1 | 11/2014 |
| KR | 1020150063177 A | 6/2015 |
| KR | 1020160070096 A | 6/2016 |
| KR | 20180100617 A | 9/2018 |
| KR | 1020200005583 A | 1/2020 |
| KR | 1020200024771 A | 3/2020 |
| KR | 1020210134616 A | 11/2021 |
| KR | 102366816 B1 | 2/2022 |
| KR | 1020220025950 A | 3/2022 |
| KR | 1020220111299 A | 8/2022 |
| KR | 102511414 B1 | 3/2023 |
| KR | 20240155976 A | 10/2024 |
| PE | 20231649 A1 | 10/2023 |
| TW | 201125808 A | 8/2011 |
| TW | 201734155 A | 10/2017 |
| TW | I780037 B | 10/2022 |
| WO | 2000017102 A1 | 3/2000 |
| WO | 2008046058 A3 | 10/2008 |
| WO | 2010002805 A1 | 1/2010 |
| WO | 2010076885 A1 | 7/2010 |
| WO | 2012040637 A2 | 3/2012 |
| WO | 2012047359 A1 | 4/2012 |
| WO | 2013170249 A1 | 11/2013 |
| WO | 2014208896 A1 | 12/2014 |
| WO | 2015077629 A1 | 5/2015 |
| WO | 2016094580 A1 | 6/2016 |
| WO | 2017096058 A1 | 6/2017 |
| WO | 2017118093 A1 | 7/2017 |
| WO | 2017120214 A1 | 7/2017 |
| WO | 2018204870 A1 | 11/2018 |
| WO | 2018208284 A1 | 11/2018 |
| WO | 2020142770 A1 | 7/2020 |
| WO | 2021113742 A1 | 6/2021 |
| WO | 2021225958 A1 | 11/2021 |
| WO | 2025151558 A1 | 7/2025 |

OTHER PUBLICATIONS

Yoo, et al., Carbon dioxide capacity of sodium hydroxide aqueous solution, Journal of Environmental Management 2013; 114: 512-519 (Year: 2013).*

Bronikowski, et al., Gas-phase production of carbon single-walled nanotubes, J. Vac. Sci. Technol. A 2001; 19(4): 1800-1805 (Year: 2001).*

Gangoli, et al., The State of HiPco Single-Walled Carbon Nanotubes in 2019, Journal of Carbon Research 2019; 5: 65, pp., 1-9 (Year: 2019).*

Definition of "configure," accessed online at: https://www.merriam-webster.com/dictionary/configured on Oct. 16, 2025 (Year: 2025).*

Definition of "room temperature," accessed online at https://www.oed.com/dictionary/room-temperature_n?tab=meaning_and_use#24897404100 on Oct. 1, 2025 (Year: 2025).*

Definition of "room temperature," accessed online at https://www.dictionary.com/browse/room%20temperature on Oct. 1, 2025 (Year: 2025).*

Definition of "room temperature," accessed online at https://www.merriam-webster.com/dictionary/room%20temperature on Oct. 1, 2025 (Year: 2025).*

Ramesh, et al., Identification of Large Fullerenes Formed during the Growth of Single-Walled Carbon Nanotubes in HiPco Process, J. Phys. Chem. B. 2003; 107: 1360-1365 (Year: 2003).*

International Preliminary Report on Patentability for International Application PCT/US2020/063455, Report issued May 17, 2022, Mailed on Jun. 16, 2022, 6 pgs.

International Search Report and Written Opinion for International Application No. PCT/US2020/063455, Search completed Mar. 31, 2021, Mailed Apr. 20, 2021, 14 pgs.

Bronikowski et al., "Gas-phase production of carbon single-walled nanotubes from carbon monoxide via the HiPco process: a parametric study", Journal of Vacuum Science & Technology A, May 2, 2001, vol. 19, No. 4, pp. 1800-1805, doi: 10.1116/1.1380721.

Chen et al., "Mitigation of Electrical Failure of Silver Nanowires under Current Flow and the Application for Long Lifetime Organic Light-Emitting Diodes", Advanced Electronic Materials, Jul. 8, 2016, vol. 2, No. 8, Article 1600167, pp. 1-10, doi: 10.1002/aelm.201600167.

Chen et al., "Thermally Stable Silver Nanowire-Polyimide Transparent Electrode Based on Atomic Layer Deposition of Zinc Oxide

(56) References Cited

OTHER PUBLICATIONS on Silver Nanowires", Advanced Functional Materials, Dec. 22, 2015, vol. 25, No. 48, pp. 7512-7520, doi: 10.1002/adfm. 201503236.

Doe, "Doe Solid-State Lighting R&D Plan", Jun. 2016, 208 pgs.

Groenendaal et al., "Poly(3,4-ethylenedioxythiophene) and its Derivatives: Past, Present, and Future", Advanced Materials, Apr. 2000, vol. 12, No. 7, pp. 481-494, doi: 10.1002/(SICI)1521-4095(200004)12:7%3C481::AID-ADMA481%3E3.0.CO;2-C.

Hu et al., "Flexible organic light-emitting diodes with transparent carbon nanotube electrodes: problems and solutions", Nanotechnology, Mar. 23, 2010, vol. 21, No. 15, Article 155202, 10 pgs., doi: 10.1088/0957-4484/21/15/155202.

Jiang et al., "Ultrahigh-performance transparent conductive films of carbo-welded isolated single-wall carbon nanotubes", Sciences Advances, May 4, 2018, vol. 4, No. 5, eaap9264, pp. 1-10, doi: 10.1126/sciadv.aap9264.

Li et al., "A Solution Processed Flexible Nanocomposite Electrode with Efficient Light Extraction for Organic Light Emitting Diodes", Scientific Reports, Mar. 17, 2014, vol. 4, No. 4307, pp. 1-8, doi: 10.1038/srep04307.

Li et al., "Electronically Pure Single-Chirality Semiconducting Single-Walled Carbon Nanotube for Large-Scale Electronic Devices", ACS Applied Materials & Interfaces, Aug. 3, 2016. vol. 8, No. 32, pp. 20527-20533, doi: 10.1021/acsami.6b06647.

Li et al., "Polyfluorinated Electrolyte for Fully Printed Carbon Nanotube Electronics", Advanced Functional Materials, Oct. 11, 2016, vol. 26, No. 38, pp. 6914-6920, doi: 10.1002/adfm. 201601605.

Li et al., "Selective Protonation of Unbounded Sodium Cholates for Reversible Blue-Shift Absorption Spectra of Single-Chirality Single-Walled Carbon Nanotube in Solution", The Journal of Physical Chemistry C, Jan. 9, 2019, vol. 123, No. 4, pp. 2565-2572, doi: 10.1021/acs.jpcc.8b10785.

Li et al., "Sodium dodecyl benzene sulfonate for single-walled carbon nanotubes separation in gel chromatography", Diamond and Related Materials, Sep. 2018, vol. 88, pp. 189-192, doi: 10.1016/j.diamond.2018.07.016.

Nikolaev et al., "Gas-phase catalytic growth of single-walled carbon nanotubes from carbon monoxide", Chemical Physical Letters, Nov. 5, 1999, vol. 313, No. 1-2, pp. 91-97, doi: 10.1016/s0009-2614(99)01029-5.

Smith et al., "Using a low-index host layer to increase emission from organic light-emitting diode structures", Organic Electronics, Dec. 2006, vol. 7, No. 6, pp. 490-494, doi: 10.1016/j.orgel.2006. 07.001.

Thompson, "OLED Materials", DOE SSL R&D Workshop, San Francisco, CA, Feb. 2016, 37 pgs.

Tong et al., "Efficient Light Extraction of Organic Light-Emitting Diodes on a Fully Solution-Processed Flexible Substrate", Advanced Optical Materials, Sep. 18, 2017, First published Jul. 19, 2017, vol. 5, No. 18, 1700307, pp. 1-8, doi: 10.1002/adom.201700307.

Wang et al., "Continuous Fabrication of Meter-Scale Single-Wall Carbon Nanotube Films and Their Use in Flexible and Transparent Integrated Circuits", Advanced Materials, Aug. 9, 2018, First published Jun. 27, 2018, vol. 30, No. 32, 8 pgs., doi: 10.1002/adma. 201802057.

Wu et al., "Transparent, Conductive Carton Nanotube Films", Science, Aug. 27, 2004, vol. 305, No. 5688, pp. 1273-1276, doi: 10.1126/science.1101243.

Yu et al., "Silver Nanowire-Polymer Composite Electrodes for Efficient Polymer Solar Cells", Advanced Materials, Oct. 11, 2011, vol. 23, No. 38, pp. 4453-4457, doi: 10.1002/adma.201101992.

Zhang et al., "Correlated metals as transparent conductors", Nature Materials, Feb. 2016, vol. 15, No. 2, pp. 204-210, published online Dec. 14, 2015, doi: 10.1038/nmat4493.

Zhou et al., "Release of Retained Single-Walled Carbon Nanotubes in Gels", Langmuir, Sep. 14, 2018, vol. 34, No. 40, pp. 12224-12232, doi: 10.1021/acs.langmuir.8b02403.

Definition of "form," Merriam Webster Online, Retrieved from the Internet on Feb. 20, 2016, 12 pgs.

Extended European Search Report for European Application No. 21800910.8, Search completed Jan. 29, 2024, Mailed Feb. 8, 2024, 7 pgs.

International Preliminary Report on Patentability for International Application No. PCT/US2018/031230, Report issued Nov. 5, 2019, Mailed Nov. 14, 2019, 08 pgs.

International Preliminary Report on Patentability received for International Application No. PCT/US2014/066926, Report issued May 24, 2016, Mailed Jun. 6, 2016, 12 pgs.

International Preliminary Report on Patentability received for International Application No. PCT/US2017/012161, Report issued Jul. 10, 2018, Mailed Jul. 19, 2018, 11 pgs.

International Preliminary Report on Patentability received for International Application No. PCT/US2017/031619, Report issued Nov. 12, 2019, Mailed Nov. 21, 2019, 08 pgs.

International Preliminary Report on Patentability received for International Application No. PCT/US2020/012364, Report issued Jun. 16, 2021, Mailed on Jul. 15, 2021, 8 pgs.

International Preliminary Report on Patentability received for International Application PCT/US2021/030460, Report issued Nov. 8, 2022, Mailed on Nov. 17, 2022, 11 pgs.

International Search Report and Written Opinion received for International Application No. PCT/US2025/010816, Search completed Apr. 29, 2025, Mailed May 9, 2025, 12 pgs.

International Search Report and Written Opinion received for International Application No. PCT/US2014/066926, Report Completed Feb. 2, 2015, Mailed Mar. 3, 2015, 14 pgs.

International Search Report and Written Opinion received for International Application No. PCT/US2016/064449, Search completed Mar. 17, 2017, Mailed Apr. 4, 2017, 12 pgs.

International Search Report and Written Opinion received for International Application No. PCT/US2017/012161, Search completed Feb. 24, 2017, Mailed May 5, 2017, 14 pgs.

International Search Report and Written Opinion received for International Application No. PCT/US2017/031619, Search completed Jul. 11, 2017, Mailed Aug. 14, 2017, 15 pgs.

International Search Report and Written Opinion received for International Application No. PCT/US2018/031230, Search completed Jul. 16, 2018, Mailed Aug. 1, 2018, 13 pgs.

International Search Report and Written Opinion received for International Application No. PCT/US2020/012364, Report Completed on Feb. 25, 2020, Mailed on Mar. 13, 2020, 10 pgs.

International Search Report and Written Opinion received for International Application No. PCT/US2021/030460, completed Jul. 15, 2021, mailed Sep. 24, 2021, 18 pgs.

"Global Flat Panel Displays Market to Reach US$110 Billion by 2017", Global Industry Analysts, Inc., Mar. 15, 2012, 3 pgs.

"Large AMOLED gets a cost edge over LCD", Sector Report Display, Korea Investment & Securities Co., Ltd. Aug. 16, 2011, 32 pgs.

"LCD TV Growth Improving, As Plasma and CRT TV Disappear", NPD Display Search, Apr. 16, 2014, 2 pgs.

"NSF Protocol P248 Military Operations Microbiological Water Purifiers", NSF International, Feb. 1, 2012, 2 pgs.

"Oxide TFT production forecast to overtake LTPS in 2016", NPD DisplaySearch TFT LCD Process Roadmap Report, Sep. 10, 2013, 4 pgs.

"Spin coating", Wikipedia, Oct. 23, 2015, 2 pgs.

"Technical Bulletin Medical: Sanitary Control and Surveillance of Field Water Supplies", (TB MED) 577, United States Department of the Army, Dec. 2005, 194 pgs.

Almudever et al., "Variability and reliability of CNFET technology: Impact of manufacturing imperfections", Microelectronics Reliability, vol. 55, No. 2, Feb. 2015, pp. 358-366, doi: 10.1016/j.microrel. 2014.11.011.

Antaris et al., "Probing and Tailoring pH-Dependent Interactions between Block Copolymers and Single-Walled Carbon Nanotubes for Density Gradient Sorting", Journal of Physical Chemistry C, vol. 116, No. 37, Aug. 28, 2012, pp. 20103-20108, doi: 10.1021/jp3063564.

(56) References Cited

OTHER PUBLICATIONS

Aradhya et al., "Electrothermal Bonding of Carbon Nanotubes to Glass", Journal of The Electrochemical Society, vol. 155, No. 9, Jul. 22, 2008, pp. K161-K165, doi: 10.1149/1.2952814.

Armstrong et al., "Enhanced Propellant Combustion with Nanoparticles", Nano Letters, vol. 3, No. 2, Jan. 9, 2003, pp. 253-255, doi: 10.1021/nl025905k.

Arnold et al., "Sorting carbon nanotubes by electronic structure using density differentiation", Nature Nanotechnology, vol. 3, Oct. 2006, pp. 60-65, doi: 10.1038/nnano.2006.52.

Bachilo et al., "Structure-Assigned Optical Spectra of Single-Walled Carbon Nanotubes", Science, vol. 298, No. 5602, Dec. 20, 2002, pp. 2361-2366, doi: 10.1126/science.1078727.

Badakhshan et al., "Photo-ignition of Liquid Fuel Spray and Solid Rocket Fuel by Carbon Nanotube Utilizing a Camera Flash", Air Force Research Laboratory, AFRL/RZSA, Nov. 23, 2011, 22 pgs.

Ben-Sasson et al., "Patterned electrode vertical field effect transistor fabricated using block copolymer nanotemplates", Applied Physics Letters, vol. 95, No. 21, Article 213301, Nov. 23, 2009, pp. 213301-1-213301-3, doi: 10.1063/1.3266855.

Park et al., "High-resolution electrohydrodynamic jet printing", Nature Materials, vol. 6, Oct. 2007, pp. 782-789, doi: 10.1038/nmat1974.

Park et al., "Large-Area Assembly of Densely Aligned Single-Walled Carbon Nanotubes Using Solution Shearing and Their Application to Field-Effect Transistors", Advanced Materials, vol. 27, No. 16, Apr. 24, 2015, pp. 2656-2662, doi: 10.1002/adma. 201405289.

Pei et al., "Polymer Light-Emitting Electrochemical Cells", Science, vol. 269, No. 5227, Aug. 25, 1995, pp. 1086-1088, doi: 10.1126/science.269.5227.1086.

Perebeinos et al., "Schottky-to-Ohmic Crossover in Carbon Nanotube Transistor Contacts", Physical Review Letters, vol. 111, No. 23, Article 236802, Dec. 6, 2013, pp. 236802-1-236802-5, doi: 10.1103/PhysRevLett.111.236802.

Pivkina et al., "Nanomaterials for Heterogeneous Combustion", Propellants, Explosives, Pyrotechnics, vol. 29, No. 1, Feb. 2004, pp. 39-48, doi: 10.1002/prep.200400025.

Powell, "The Physics of Amorphous-Silicon Thin-Film Transistors", IEEE Transactions on Electron Devices, vol. 36, No. 12, Dec. 1989, pp. 2753-2763, doi: 10.1109/16.40933.

Rossi, "Two Decades of Research on Nano-Energetic Materials", Propellants, Explosives, Pyrotechnics, vol. 39, No. 3, Jun. 2014, pp. 323-327, doi: 10.1002/prep.201480151.

Rouhi et al., "Fundamental Limits on the Mobility of Nanotube-Based Semiconducting Inks", Advanced Materials, vol. 23, No. 1, Jan. 4, 2011, pp. 94-99, doi: 10.1002/adma.201003281.

Rouhi et al., "High Performance Semiconducting Nanotube Inks: Progress and Prospects", ACS Nano, vol. 5, No. 11, Oct. 4, 2011, pp. 8471-8487, doi: 10.1021/nn201828y.

Rutherglen et al., "Nanotube electronics for radiofrequency applications", Nature Nanotechnology, vol. 4, Dec. 2009, pp. 811-819, doi: 10.1038/NNANO.2009.355.

Sabourin et al., "Functionalized Graphene Sheet Colloids for Enhanced Fuel/ Propellant Combustion", ACS Nano, vol. 3, No. 12, Nov. 19, 2009, pp. 3945-3954, doi: 10.1021/nn901006w.

Schoppler et al., "Molar Extinction Coefficient of Single-Wall Carbon Nanotubes", Journal of Physical Chemistry C, vol. 115, No. 30, Jun. 22, 2011, pp. 14682-14686, doi: 10.1021/jp205289h.

Seo et al., "Diameter Refinement of Semiconducting Arc Discharge Single-Walled Carbon Nanotubes via Density Gradient Ultracentrifugation", The Journal of Physical Chemistry Letters, vol. 4, No. 17, Aug. 7, 2013, pp. 2805-2810, doi: 10.1021/jz4013596.

Seo et al., "Improved High-Efficiency Organic Solar Cells via Incorporation of a Conjugated Polyelectrolyte Interlayer", Journal of the American Chemical Society, vol. 133, No. 22, May 10, 2011, pp. 8416-8419, doi: 10.1021/ja2037673.

Seo et al., "Improved Injection in n-Type Organic Transistors with Conjugated Polyelectrolytes", Journal of the American Chemical Society, vol. 131, No. 51, Dec. 7, 2009, pp. 18220-18221, doi: 10.1021/ja908441c.

Seo et al., "Solution-Processed Organic Light-Emitting Transistors Incorporating Conjugated Polyelectrolytes", Advanced Functional Materials, vol. 21, No. 19, Oct. 7, 2011, pp. 3667-3672, doi: 10.1002/adfm.201100682.

Shao et al., "Long-Lifetime Polymer Light-Emitting Electrochemical Cells", Advanced Materials, vol. 19, No. 3, Feb. 2007, pp. 365-370, doi: 10.1002/adma.200602087.

Shastry et al., "Large-Area, Electronically Monodisperse, Aligned Single-Walled Carbon Nanotube Thin Films Fabricated by Evaporation-Driven Self-Assembly", Small, vol. 9, No. 1, Jan. 14, 2013, pp. 45-51, doi: 10.1002/smll.201201398.

Shulaker et al., "Carbon nanotube computer", Nature, vol. 501, Sep. 26, 2013, pp. 526-530, doi: 10.1038/nature12502.

Sirringhaus et al., "Integrated Optoelectronic Devices Based on Conjugated Polymers", Science, vol. 280, No. 5370, Jun. 12, 1998, pp. 1741-1744, doi: 10.1126/science.280.5370.1741.

Slinker et al., "Direct measurement of the electric-field distribution in a light-emitting electrochemical cell", Nature Materials, vol. 6, Nov. 2007, pp. 894-899, doi: 10.1038/nmat2021.

Smits et al., "Response of Fe powder, purified and as-produced HiPco single-walled carbon nanotubes to flash exposure", Materials Science and Engineering A, vol. 358, No. 1-2, Oct. 15, 2003, pp. 384-389, doi: 10.1016/S0921-5093(03)00282-X.

Sohrabi et al., "Dispersion of Carbon Nanotubes Using Mixed Surfactants: Experimental and Molecular Dynamics Simulation Studies", The Journal of Physical Chemistry B, vol. 118, No. 11, Feb. 20, 2014, pp. 3094-3103, doi: 10.1021/jp407532j.

Swensen et al., "Light emission from an ambipolar semiconducting polymer field-effect transistor", Applied Physics Letters, vol. 87, No. 25, Article 253511, Dec. 19, 2005, pp. 253511-1-253511-3, doi: 10.1063/1.2149986.

Sze et al., "Physics of Semiconductor Devices", Third Edition, Wiley & Sons, Inc., 2007, 761 pgs. (Presented in 3 Parts).

Takahashi et al., "Carbon Nanotube Active-Matrix Backplanes for Conformal Electronics and Sensors", Nano Letters, vol. 11, No. 12, Nov. 3, 2011, pp. 5408-5413, doi: 10.1021/nl203117h.

Takizawa et al., "Effective Antiscaling Performance of Reverse-Osmosis Membranes Made of Carbon Nanotubes and Polyamide Nanocomposites", ACS Omega, vol. 3, No. 6, Jun. 5, 2018, pp. 6047-6055, doi: 10.1021/acsomega.8b00601.

Tang et al., "Enhanced Flux and Electrochemical Cleaning of Silicate Scaling on Carbon Nanotube-Coated Membrane Distillation Membranes Treating Geothermal Brines", ACS Applied Materials & Interfaces, vol. 9, No. 44, Oct. 13, 2017, pp. 38594-38605, doi: 10.1021/acsami.7b12615.

Tang et al., "Organic electroluminescent diodes", Applied Physics Letters, vol. 51, No. 12, Sep. 21, 1987, pp. 913-915, doi: 10.1063/1.98799.

Tans et al., "Room-temperature transistor based on a single carbon nanotube", Nature, vol. 393, May 7, 1998, pp. 49-52, doi: 10.1038/29954.

Treacy et al., "Exceptionally high young's modulus observed for individual carbon nanotubes", Nature, vol. 381, Jun. 20, 1996, pp. 678-680, doi: 10.1038/381678a0.

Tunuguntla et al., "Enhanced water permeability and tunable ion selectivity in subnanometer carbon nanotube porins", Science, vol. 357, No. 6353, Aug. 25, 2017, pp. 792-796, doi: 10.1126/science.aan2438.

Wang et al., "Ultrahigh Frequency Carbon Nanotube Transistor Based on a Single Nanotube", IEEE Transactions on Nanotechnology, vol. 6, No. 4, Jul. 2007, pp. 400-403, doi: 10.1109/TNANO.2007.901179.

Wang et al., "Wafer-Scale Fabrication of Separated Carbon Nanotube Thin-Film Transistors for Display Applications", Nano Letters, vol. 9, No. 12, Nov. 10, 2009, pp. 4285-4291, doi: 10.1021/nl902522f.

Wirth, "Experimental Study on the Aerospace Applications of Photoreactive Nanomaterials", Thesis, UCLA, 2012, 111 pgs.

(56) References Cited

OTHER PUBLICATIONS

Wu et al., "Self-Assembly of Semiconducting Single-Walled Carbon Nanotubes into Dense, Aligned Rafts", Small, vol. 9, No. 24, Dec. 20, 2013, pp. 4142-4148, doi: 10.1002/smll.201301547.

Wu et al., "Top-Down Patterning and Self-Assembly for Regular Arrays of Semiconducting Single-Walled Carbon Nanotubes", Advanced Materials, vol. 26, No. 35, Sep. 17, 2014, pp. 6151-6156, doi: 10.1002/adma.201401108.

Xia et al., "Printed Sub-2 V Gel-Electrolyte-Gated Polymer Transistors and Circuits", Advanced Functional Materials, vol. 20, No. 4, Feb. 22, 2010, pp. 587-594, doi: 10.1002/adfm.200901845.

Xu et al., "Vertical organic light emitting transistor", Applied Physics Letters, vol. 91, No. 9, Article 092911, Aug. 27, 2007, pp. 092991-1-092991-3, doi: 10.1063/1.2778751.

Yamauchi et al., "Fabrication of Vertical Organic Light-Emitting Transistor Using ZnO Thin Film", Japanese Journal of Applied Physics, vol. 46, No. 4B, Apr. 24, 2007, pp. 2678-2682, doi: 10.1143/JJAP.46.2678.

Yan et al., "A high-mobility electron-transporting polymer for printed transistors", Nature, vol. 457, Feb. 5, 2009, pp. 679-686, doi: 10.1038/nature07727.

Yang et al., "Control of Cationic Conjugated Polymer Performance in Light Emitting Diodes by Choice of Counterion", Journal of the American Chemical Society, vol. 128, No. 45, Oct. 20, 2006, pp. 14422-14423, doi: 10.1021/ja063723c.

Young, "When Can I Get My AMOLED TV?", Information Display, vol. 26, No. 10, Oct. 2010, pp. 24-28, doi: 10.1002/j.2637-496X.2010.tb00312.x.

Yu et al., "Microwave nanotube transistor operation at high bias", Applied Physics Letters, vol. 88, No. 23, Article 233115, Jun. 5, 2006, pp. 233115-1-233115-3, doi: 10.1063/1.2210447.

Zaumseil et al., "Spatial control of the recombination zone in an ambipolar light-emitting organic transistor", Nature Materials, vol. 5, Jan. 2006, pp. 69-74, doi: 10.1038/nmat1537.

Zhang et al., "Self-Enhanced Catalytic Activities of Functionalized Graphene Sheets in the Combustion of Nitromethane: Molecular Dynamic Simulations by Molecular Reactive Force Field", ACS Applied Materials & Interfaces, vol. 6, No. 15, Jul. 23, 2014, pp. 12235-12244, doi: 10.1021/am501562m.

Zhao et al., "Preparation of Carbon-coated Nano-Fe, Co Particles and their Effects on the Thermal Decomposition of Ammonium Perchlorate", Advanced Materials Research, vol. 152-153, Oct. 2010, pp. 309-314, doi: 10.4028/www.scientific.net/AMR.152-153.309.

Zou et al., "Carbon Nanotube Driver Circuit for 6 × 6 Organic Light Emitting Diode Display", Scientific Reports, vol. 5, Article 11755, Jun. 29, 2015, 9 pgs., doi: 10.1038/srep11755.

Bhat et al., "Electroluminescence in Ion-Gel Gated Conjugated Polymer Field-Effect Transistors", Chemistry of Materials, vol. 24, No. 21, Oct. 7, 2012, pp. 4060-4067, doi: 10.1021/cm301610w.

Bonhommeau et al., "Raman Spectroscopic Investigation of Individual Single-Walled Carbon Nanotubes Helically Wrapped by Ionic, Semiconducting Polymers", The Journal of Physical Chemistry C, vol. 117, No. 28, Jun. 20, 2013, pp. 14840-14849, doi: 10.1021/jp4037606.

Brack et al., "Individual Soldier / Small Unit Desalination Device", Department of Defense, Army SBIR Solicitation, Aug. 24-Oct. 24, 2018, Topic No. A18-149, 3 pgs.

Brady et al., "Quasi-ballistic carbon nanotube array transistors with current density exceeding Si and GaAs", Science Advances, vol. 2, No. 9, Article e1601240, Sep. 2, 2016, 9 pgs., doi: 10.1126/sciadv.1601240.

Braga et al., "High-Transconductance Organic Thin-Film Electrochemical Transistors for Driving Low-Voltage Red-Green-Blue Active Matrix Organic Light-Emitting Devices", Advanced Functional Materials, vol. 22, No. 8, Apr. 24, 2012, pp. 1623-1631, doi: 10.1002/adfm.201102075.

Briseno et al., "Patterning Organic Single-Crystal Transistor Arrays", Nature, vol. 444, Dec. 14, 2006, pp. 913-917, doi: 10.1038/nature05427.

Brousseau et al., "Nanometric Aluminum in Explosives", Propellants, Explosives, Pyrotechnics, vol. 27, No. 5, Nov. 2002, pp. 300-306, doi: 10.1002/1521-4087(200211)27:5<300::AID-PREP300>3.0.CO;2-#.

Cao et al., "Fringing-field dielectrophoretic assembly of ultrahigh-density semiconducting nanotube arrays with a self-limited pitch", Nature Communications, vol. 5, Article 5071, Sep. 26, 2014, 7 pgs., doi: 10.1038/ncomms6071.

Cao et al., "High-performance radio frequency transistors based on diameter-separated semiconducting carbon nanotubes", Applied Physics Letters, vol. 108, No. 23, Article 233105, Jun. 8, 2016, pp. 233105-1-233105-5, doi: 10.1063/1.4953074.

Cao et al., "Improved quantum efficiency for electroluminescence in semiconducting polymers", Nature, vol. 397, Feb. 4, 1999, pp. 414-417, doi: 10.1038/17087.

Cao et al., "Medium-scale carbon nanotube thin-film integrated circuits on flexible plastic substrate", Nature, vol. 454, Jul. 24, 2008, pp. 495-500, doi: 10.1038/nature07110.

Cao et al., "Radio Frequency Transistors Using Aligned Semiconducting Carbon Nanotubes with Current-Gain Cutoff Frequency and Maximum Oscillation Frequency Simultaneously Greater than 70 GHz", ACS Nano, vol. 10, No. 7, Jun. 21, 2016, pp. 6782-6790, doi: 10.1021/acsnano.6b02395.

Cao et al., "Supplementary Materials for Carbon Nanotube Transistors Scaled to a 40-Nanometer a Footprint", Science, vol. 356, No. 6345, Article 1369, Jun. 30, 2017, 22 pgs., doi: 10.1126/science.aan2476.

Capelli et al., "Organic light-emitting transistors with an efficiency that outperforms the equivalent light-emitting diodes", Nature Materials, vol. 9, Jun. 2010, pp. 496-503, doi: 10.1038/NMAT2751.

Chaban et al., "Buckybomb: Reactive Molecular Dynamics Simulation", Journal of Physical Chemistry Letters, vol. 6, No. 5, Feb. 24, 2015, pp. 913-917, doi: 10.1021/acs.jpclett.5b00120.

Chang et al., "Improved Electrical Performance of MILC Poly-Si TFTs Using CF4 Plasma by Etching Surface of Channel", IEEE Electron Device Letters, vol. 30, No. 2, Feb. 2009, pp. 130-132, doi: 10.1091/LED.2008.2010064.

Chen, "Advanced Light Extraction Structure of OLED Lighting", DOE SSL Project Portfolio, Energy Efficient and Renewable Energy, 2016, 10 pgs.

Chen et al., "The Role of Metal-Nanotube Contact in the Performance of Carbon Nanotube Field-Effect Transistors", Nano Letters, vol. 5, No. 7, Jun. 24, 2005, pp. 1497-1502, doi: 10.1021/nl0508624.

Cherenack et al., "Amorphous—Silicon Thin-Film Transistors Fabricated at 300° C. on a Free-Standing Foil Substrate of Clear Plastic", IEEE Electron Device Letters, vol. 28, No. 11, Nov. 2007, pp. 1004-1006, doi: 10.1109/LED.2007.907411.

Chiang et al., "Purification and Characterization of Single-Wall Carbon Nanotubes (SWNTs) Obtained from the Gas-Phase Decomposition of CO (HiPco Process)", The Journal of Physical Chemistry B, vol. 105, No. 35, Aug. 10, 2001, pp. 8297-8301, doi: 10.1021/jp0114891.

Cho et al., "Printable ion-gel gate dielectrics for low-voltage polymer thin-film transistors on plastic", Nature Materials, vol. 7, Nov. 2008, pp. 900-906, doi: 10.1038/nmat2291.

Chortos et al., "Investigating Limiting Factors in Stretchable All-Carbon Transistors for Reliable Stretchable Electronics", ACS Nano, vol. 11, No. 8, Jul. 26, 2017, pp. 7925-7937, doi: 10.1021/acsnano.7b02458.

Chortos et al., "Mechanically Durable and Highly Stretchable Transistors Employing Carbon Nanotube Semiconductor and Electrodes", Advanced Materials, vol. 28, No. 22, Jun. 8, 2016, pp. 4441-4448, doi: 10.1002/adma.201501828.

Cooper et al., "Light Extraction for OLEDs", DOE SSL R&D Workshop, Pixelligent, 2015, 18 pgs.

Culp et al., "Electron tomography reveals details of the internal microstructure of desalination membranes", PNAS, vol. 115, No. 35, Aug. 28, 2018, pp. 8694-8699, doi: 10.1073/pnas.1804708115.

Dai et al., "Solution-processed, high-performance light-emitting diodes based on quantum dots", Nature, vol. 515, Nov. 6, 2014, pp. 96-99, doi: 10.1038/nature13829.

(56)　　　　　　References Cited

OTHER PUBLICATIONS

Danczyk et al., "Ignition of Propellants Through Nanostructured Materials", Air Force Research Laboratory (AFMC) AFRL/ RQRC, Mar. 2016, 27 pgs.

De Volder et al., "Carbon Nanotubes: Present and Future Commercial Applications", Science, vol. 339, No. 6119, Feb. 1, 2013, pp. 535-539, doi: 10.1126/science.1222453.

Dlott, "Thinking big (and small) about energetic materials", Materials Science and Technology, vol. 22, No. 4, 2006, pp. 463-473, doi: 10.1179/174328406X83987.

Drandova et al., "SiN capacitors and ESD", CS Mantech Conference, Apr. 24-27, 2006, pp. 83-86.

Dreizin, "Metal-based reactive nanomaterials", Progress in Energy and Combustion Science, vol. 35, No. 2, Apr. 2009, pp. 141-167, doi: 10.1016/j.pecs.2008.09.001.

Dresselhaus et al., "Raman spectroscopy on isolated single wall carbon nanotubes", Carbon, vol. 40, No. 12, 2002, pp. 2043-2061, doi: 10.1016/s0008-6223(02)00066-0.

Droudian et al., "Enhanced chemical separation by freestanding CNT-polyamide/imide nanofilm synthesized at the vapor-liquid interface", ACS Applied Materials & Interfaces, vol. 10, No. 23, May 29, 2018, pp. 19305-19310, doi: 10.1021/acsami.8b02329.

Friend et al., "Electroluminescence in conjugated polymers", Nature, vol. 397, Jan. 14, 1999, pp. 121-128, doi: 10.1038/16393.

Gao et al., "Complementary Logic Gate Arrays Based on Carbon Nanotube Network Transistors", Small, vol. 9, No. 6, Mar. 25, 2013, pp. 813-819, doi: 10.1002/smll.201201237.

Ghosh et al., "Advanced sorting of single-walled carbon nanotubes by nonlinear density-gradient ultracentrifugation", Nature Nanotechnology, vol. 5, May 9, 2010, pp. 443-450, doi: 10.1038/NNANO. 2010.68.

Gu et al., "Design of Flat-Panel Displays Based on Organic Light Emitting Devices", IEEE Journal of Selected Optics in Quantum Electronics, vol. 4, No. 1, Jan./Feb. 1998, pp. 83-99, doi: 10.1109/2944.669473.

Gundlach et al., "Pentacene Organic Thin-Film Transistors— Molecular Ordering and Mobility", IEEE Electron Device Letters, vol. 18, No. 3, Mar. 1997, pp. 87-89, doi: 10.1109/55.556089.

Ha et al., "Highly Uniform and Stable n-Type Carbon Nanotube Transistors by Using Positively Charged Silicon Nitride Thin Films", Nano Letters, vol. 15, No. 1, Dec. 1, 2014, pp. 392-397, doi: 10.1021/nl5037098.

Hennrich et al., "Length-Sorted, Large-Diameter, Polyfluorene-Wrapped Semiconducting Single-Walled Carbon Nanotubes for High-Density, Short-Channel Transistors", ACS Nano, vol. 10, No. 2, Jan. 20, 2016, pp. 1888-1895, doi: 10.1021/acsnano.5b05572.

Hinds et al., "Aligned Multiwalled Carbon Nanotube Membranes", Science, vol. 303, No. 5654, Jan. 2, 2004, pp. 62-65, doi: 10.1126/science.1092048.

Ho et al., "Molecular-scale interface engineering for polymer light-emitting diodes", Nature, vol. 404, Mar. 30, 2000, pp. 481-484, doi: 10.1038/35006610.

Holt et al., "Fast Mass Transport Through Sub-2-Nanometer Carbon Nanotubes", Science, vol. 312, No. 5776, May 19, 2006, pp. 1034-1037, doi: 10.1126/science.1126298.

Hone et al., "Thermal properties of carbon nanotubes and nanotube-based materials", Applied Physics A, vol. 74, 2002, pp. 339-343, doi: 10.1007/s003390201277.

Hoven et al., "Electron injection into organic semiconductor devices from high work function cathodes", Proceedings of the National Academy of Sciences of the United States of America, vol. 105, No. 35, Sep. 2, 2008, pp. 12730-12735, doi: 10.1073/pnas.0806494105.

Hoven et al., "Ion Motion in Conjugated Polyelectrolyte Electron Transporting Layers", Journal of the American Chemical Society, vol. 129, No. 36, Aug. 17, 2007, pp. 10976-10977, doi: 10.1021/ja072612q.

Hsu et al., "Control of Efficiency, Brightness, and Recombination Zone in Light-Emitting Field Effect Transistors", Advanced Materials, vol. 24, No. 9, Mar. 2, 2012, pp. 1171-1175, doi: 10.1002/adma.201103513.

Iechi et al., "Vertical type organic light emitting device using thin-film ZnO electrode", Synthetic Metals, vol. 154, No. 1-3, Sep. 22, 2005, pp. 149-152, doi: 10.1016/j.synthmet.2005.07.038.

Inukai et al., "High-performance multifunctional reverse osmosis membranes obtained by carbon nanotube polyamide nanocomposite", Scientific Reports, vol. 5, Article 13562, Sep. 3, 2015, 10 pgs., doi: 10.1038/srep13562.

Isert et al., "The effect of encapsulated nanosized catalysts on the combustion of composite solid propellants", Combustion and Flame, vol. 162, No. 5, May 2015, pp. 1821-1828, doi: 10.1016/j.combustflame. 2014.11.040.

Javey et al., "Ballistic carbon nanotube field-effect transistors", Nature, vol. 424, Aug. 7, 2003, pp. 654-657, doi: 10.1038/nature01797.

Javey et al., "High-K dielectrics for advanced carbon-nanotube transistors and logic gates", Nature Materials, vol. 1, Dec. 2002, pp. 241-245, doi: 1038/nmat769.

Javey et al., "Self-Aligned Ballistic Molecular Transistors and Electrically Parallel Nanotube Arrays", Nano Letters, vol. 4, No. 7, Jun. 23, 2004, pp. 1319-1322, doi: 10.1021/nl049222b.

Jiang et al., "Superaligned Carbon Nanotube Arrays, Films, and Yarns: A Road to Applications", Advanced Materials, vol. 23, No. 9, Mar. 4, 2011, pp. 1154-1161, doi: 10.1002/adma.201003989.

Joo et al., "Dose-Controlled, Floating Evaporative Self-assembly and Alignment of Semiconducting Carbon Nanotubes from Organic Solvents", Langmuir, vol. 30, No. 12, Mar. 2, 2014, pp. 3460-3466, doi: 10.1021/la500162x.

Ju et al., "Transparent Active Matrix Organic Light-Emitting Diode Displays Driven by Nanowire Transistor Circuitry", Nano Letters, vol. 8, No. 4, Dec. 11, 2007, pp. 997-1004, doi: 10.1021/nl072538+.

Kawai et al., "Self-formation of highly aligned metallic, semiconducting and single chiral single-walled carbon nanotubes assemblies via a crystal template method", Applied Physics Letters, vol. 105, No. 9, Article 093102, Sep. 1, 2014, pp. 093102-1-093102-4, doi: 10.1063/1.4895103.

Kawai et al., "Single Chirality Extraction of Single-Wall Carbon Nanotubes for the Encapsulation of Organic Molecules", Journal of the American Chemical Society, vol. 134, No. 23, May 30, 2012, pp. 9545-9548, doi: 10.1021/ja3013853.

Keplinger et al., "Stretchable, Transparent, Ionic Conductors", Science, vol. 341, No. 6149, Aug. 30, 2013, pp. 984-987, doi: 10.1126/science.1240228.

Kim et al., "Electrical contacts to carbon nanotubes down to 1 nm in diameter", Applied Physics Letters, vol. 87, No. 17, Article 173101, Oct. 24, 2005, pp. 173101-1-173101-3, doi: 10.1063/1. 2108127.

Kim et al., "Polymer Gate Dielectric Surface Viscoelasticity Modulates Pentacene Transistor Performance", Science, vol. 318, No. 5847, Oct. 5, 2007, pp. 76-80, doi: 10.1126/science.1146458.

Kimura et al., "Low-Temperature Polysilicon Thin-Film Transistor Driving with Integrated Driver for High Resolution Light Emitting Polymer Display", IEEE Transactions on Electron Devices, vol. 46, No. 12, Dec. 1999, pp. 2282-2288, doi: 10.1109/16.808054.

Krupke et al., "Contacting single bundles of carbon nanotubes with alternating electric fields", Applied Physics A, vol. 76, Mar. 2003, pp. 397-400, doi: 10.1007/s00339-002-1592-4.

Kudo, "Organic light emitting transistors", Current Applied Physics, vol. 5, No. 4, May 2005, pp. 337-340, doi: 10.1016/j.cap.2003. 11.095.

Li, "The Effect of Interface States on Single-Walled Carbon Nanotube Transistors", ECS Journal of Solid State Science and Technology, vol. 5, No. 9, Aug. 5, 2016, pp. M93-M98, doi: 10.1149/2. 0271609jss.

Li et al., "Carbon Nanotube Transistor Operation at 2.6 GHz", Nano Letters, vol. 4, No. 4, Mar. 23, 2004, pp. 753-756, doi: 10.1021/nl0498740.

Li et al., "Effects of Ambient Air and Temperature on Ionic Gel Gated Single-Walled Carbon Nanotube Thin-Film Transistor and Circuits", ACS Applied Materials & Interfaces, vol. 7, No. 41, Sep. 29, 2015, pp. 22881-22887, doi: 10.1021/acsami.5b05727.

Li et al., "Electrochemical Oxidations of p-Doped Semiconducting Single-Walled Carbon Nanotubes", Journal of Nanotechnology, vol. 2016, Article 8073593, 2016, 8 pgs., doi: 10.1155/2016/8073593.

(56)                    References Cited

OTHER PUBLICATIONS

Li et al., "Langmuir-Blodgett Assembly of Densely Aligned Single-Walled Carbon Nanotubes from Bulk Materials", Journal of the American Chemical Society, vol. 129, No. 16, Mar. 30, 2007, pp. 4890-4891, doi: 10.1021/ja071114e.

Li et al., "Molecular Design, Device Function and Surface Potential of Zwitterionic Electron Injection Layers", Journal of the American Chemical Society, vol. 131, No. 25, May 21, 2009, pp. 8903-8912, doi: 10.1021/ja9018836.

Li et al., "Silicon nitride gate dielectric for top-gated carbon nanotube field effect transistors", Journal of Vacuum Science & Technology B, vol. 22, No. 6, Nov.-Dec. 2004, pp. 3112-3114, doi: 10.1116/1.1824048.

Li et al., "Transfer Printing of Submicrometer Patterns of Aligned Carbon Nanotubes onto Functionalized Electrodes", Small, vol. 3, No. 4, Apr. 2, 2007, pp. 616-621, doi: 10.1002/smll.200600525.

Li et al., "Visualizing Helical Wrapping of Semiconducting Single-Walled Carbon Nanotubes by Surfactants and Their Impacts on Electronic Properties", Chemistry Select, vol. 1, No. 13, Aug. 16, 2016, pp. 3569-3572, doi: 10.1002/slct.201601033.

Li et al., "Water-ion permselectivity of narrow-diameter carbon nanotubes", Science Advances, vol. 6, Article eaba9966, Sep. 16, 2020, 9 pgs., doi: 10.1126/sciadv.aba9966.

Liang et al., "Elastomeric polymer light-emitting devices and displays", Nature Photonics, vol. 7, Oct. 2013, pp. 817-824. doi: 10.1038/NPHOTON.2013.242.

Lin et al., "A Cell—Compatible Conductive Film from a Carbon Nanotube Network Adsorbed on Poly-L-Lysine", ACS Nano, vol. 5, No. 12, Nov. 4, 2011, pp. 10026-10032, doi: 10.1021/nn203870c.

Lin et al., "A novel LTPS-TFT Pixel Circuit Compensating for TFT Threshold—Voltage Shift and OLED Degradation for AMOLED", IEEE Electron Device Letters, vol. 28, No. 2, Feb. 2007, pp. 129-131, doi: 10.1109/LED.2006.889523.

Lin et al., "Ambipolar-to-Unipolar Conversion of Carbon Nanotube Transistors by Gate Structure Engineering", Nano Letters, vol. 4, No. 5, Mar. 31, 2004, pp. 947-950, doi: 10.1021/nl049745j.

Lin et al., "The Impact of Scaling-Down Oxide Thickness on Poly-Si Thin-Film Transistors' I-V Characteristics", IEEE Electron Device Letters, vol. 15, No. 4, Apr. 30, 1994, pp. 138-139, doi: 10.1109/55.285404.

Liu et al., "Large-scale single-chirality separation of single-wall carbon nanotubes by simple gel chromatography", Nature Communications, vol. 2, Article 309, May 10, 2011, pp. 1-8, doi: 10.1038/ncomms1313.

Logdlund et al., "Theoretical studies of the interaction between aluminum and poly(p-phenylenevinylene) and derivatives", The Journal of Chemical Physics, vol. 101, No. 5, Sep. 1, 1994, pp. 4357-4364, doi: 10.1063/1.467486.

Maehashi et al., "Electrical characterization of carbon nanotube field-effect transistors with SiNx passivation films deposited by catalytic chemical vapor deposition", Applied Physics Letters, vol. 92, No. 18, Article 183111, May 5, 2008, pp. 183111-1-183111-3; doi: 10.1063/1.2920206.

Matyba et al., "The dynamic organic p-n junction", Nature Materials, vol. 8, Aug. 2009, pp. 672-676, doi: 10.1038/NMAT2478.

Mccarthy et al., "Low-Voltage, Low-Power, Organic Light-Emitting Transistors for Active Matrix Displays", Science, vol. 332, No. 6029, Apr. 29, 2011, pp. 570-573, doi: 10.1126/science. 1203052.

Mcginnis et al., "Large-scale polymeric carbon nanotube membranes with sub-1.27-nm pores", Science Advances, vol. 4, No. 3, Article e1700938, Mar. 9, 2018, 6 pgs., doi: 10.1126/sciadv. 1700938.

Meda et al., "Nano-aluminum as energetic material for rocket propellants", Materials Science and Engineering C, vol. 27, No. 5-8, Sep. 2007, pp. 1393-1396, doi: 10.1016/j.msec.2006.09.030.

Meda et al., "Nano-composites for rocket solid propellants", Composites Science and Technology, vol. 65, No. 5, Apr. 2005, pp. 769-773, doi: 10.1016/j.compscitech.2004.10.016.

Muccini, "A bright future for organic field-effect transistors", Nature Materials, vol. 5, Aug. 2006, pp. 605-613, doi: 10.1038/nmat1699.

Nakamura et al., "Improvement of Metal-Insulator-Semiconductor-Type Organic Light-Emitting Transistors", Japanese Journal of Applied Physics, vol. 47, No. 3, Mar. 21, 2008, pp. 1889-1893, doi: 10.1143/JJAP.47.1889.

Noh et al., "Ultra-thin polymer gate dielectrics for top-gate polymer field-effect transistors", Organic Electronics, vol. 10, No. 1, Feb. 2009, pp. 174-180, doi: 10.1016/j.orgel.2008.10.021.

Nomura et al., "Room-temperature fabrication of transparent flexible thin-film transistors using amorphous oxide semiconductors", Nature, vol. 432, Nov. 25, 2004, pp. 488-492, doi: 10.1038/nature03090.

O'Connell et al., "Band Gap Fluorescence from Individual Single-Walled Carbon Nanotubes", Science, vol. 297, No. 5581, Jul. 26, 2002, pp. 593-596, doi: 10.1126/science.1072631.

Oh et al., "Vertical Type Organic Transistor Using C60 and Its Application for OLET", Molecular Crystals and Liquid Crystals, vol. 458, No. 1, Dec. 21, 2006, pp. 247-254, doi: 10.1080/15421400600932439.

Ortiz-Medina et al., "Robust water desalination membranes against degradation using high loads of carbon nanotubes", Scientific Reports, vol. 8, Article 2748, Feb. 9, 2018, 11 pgs., doi: 10.1038/s41598-018-21192-5.

Panzer et al., "Low-voltage operation of a pentacene field-effect transistor with a polymer electrolyte gate dielectric", Applied Physics Letters, vol. 86, No. 10, Article 103503, Feb. 28, 2005, pp. 103503-1-103503-3, doi: 10.1063/1.1880434.

Park et al., "Enhanced luminescence in top-gate-type organic light-emitting transistors", Applied Physics Letters, vol. 85, No. 7, Aug. 16, 2004, pp. 1280-1282, doi: 10.1063/1.1784044.

Park et al., "Flexible full color organic light emitting diode display on polyimide plastic substrate driven by amorphous indium gallium zinc oxide thin-film transistors", Applied Physics Letters, vol. 95, No. 1, Article 013503, Jul. 6, 2009, pp. 013503-1-013503-3, doi: 10.1063/1.3159832.

Park et al., "High-density integration of carbon nanotubes via chemical self-assembly", Nature Nanotechnology, vol. 7, Dec. 2012, pp. 787-791, doi: 10.1038/nnano.2012.189.

* cited by examiner

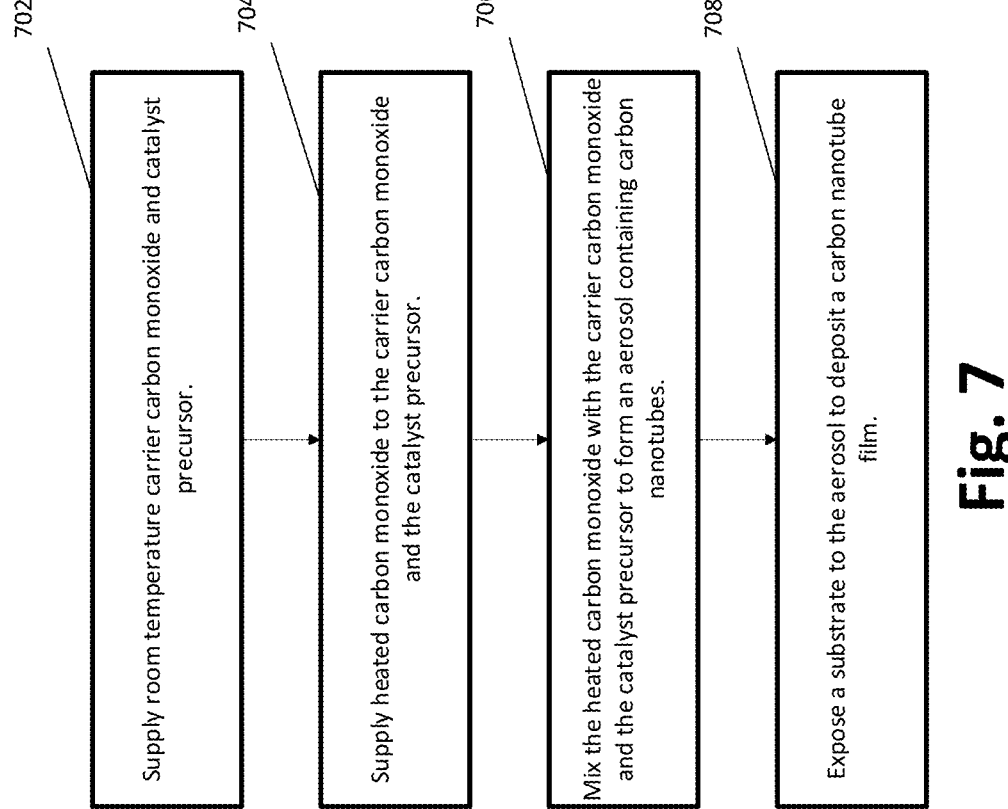

702 Supply room temperature carrier carbon monoxide and catalyst precursor.

704 Supply heated carbon monoxide to the carrier carbon monoxide and the catalyst precursor.

706 Mix the heated carbon monoxide with the carrier carbon monoxide and the catalyst precursor to form an aerosol containing carbon nanotubes.

708 Expose a substrate to the aerosol to deposit a carbon nanotube film.

Fig. 7

SINGLE-WALLED CARBON NANOTUBE FILMS AND METHOD AND APPARATUS FOR FABRICATING THEREOF

CROSS-REFERENCE TO RELATED APPLICATIONS

This application is a national stage of PCT Patent Application No. PCT/US2020/063455 entitled "Single-walled Carbon Nanotube Films and Method and Apparatus for Fabricating Thereof" filed Dec. 4, 2020, which claims the benefit of and priority under 35 U.S.C. § 119(e) to U.S. Provisional Patent Application Ser. No. 62/944,241 entitled "Methods and Apparatus for the Fabrication of Single-Walled Carbon Nanotubes," filed Dec. 5, 2019, which are incorporated herein by reference in their entirety for all purposes.

STATEMENT REGARDING FEDERALLY SPONSORED RESEARCH OR DEVELOPMENT

This invention was made with government support under Grant No. DE-SC0019990 awarded by Department of Energy. The government has certain rights in the invention.

FIELD OF THE INVENTION

The present invention generally relates to electrically conductive transparent films and apparatus and methods of fabricating thereof.

BACKGROUND

Energy-conserving technologies benefit from conductive materials of advanced composition and design that perform multiple functions such as being highly transparent and electrically conductive. One example is Organic Light Emitting Diodes (OLEDs) whose operation benefits from efficient charge introduction into various photonic layers and whose optical transmission at wavelengths of practical value is simultaneously very high. These seeming contradictory performance requirements are typically satisfied using Transparent Conducting Oxides (TCOs). Indium Tin Oxide (ITO) possessing an In:Sn atomic ratio of about 10:1, is perhaps the most common TCO coating used to manufacture OLED anodes in generic bottom-up deposited layer device designs. This popular choice evolved from the widespread use of ITO in liquid crystal displays, which is an electric field driven device rather than a current injection design such as an OLED. There are many well-documented reasons why ITO is not an ideal anode material for high efficiency OLEDs including inappropriate work function, difficulty in creating desired patterns, stability, bending on flexible substrates, availability of high quality indium and the need to process at high temperatures limiting the high speed manufacture of integrated ITO substrates.

SUMMARY OF THE INVENTION

Various embodiments are directed to a method of producing single-walled carbon nanotubes, the method including:
supplying, to a mixing zone, carrier carbon monoxide and catalyst precursor through a first inlet at a temperature below the reaction temperature of the catalyst precursor;
supplying, to a mixing zone, heated carbon monoxide through a second inlet such that the heated carbon monoxide mixes with the carrier carbon monoxide and the catalyst to form an aerosol;
reacting the aerosol in a reaction chamber to form a composite aerosol including single-walled carbon nanotubes (SWCNTs), carbon monoxide, and carbon dioxide; and
exposing a substrate to the composite aerosol to deposit a SWCNT film on a surface of the substrate.

In various other embodiments, the second inlet includes a showerhead.

In still various other embodiments, the heated carbon monoxide is at a temperature of 1000° C.-1100° C.

In still various other embodiments, the pressure within the reaction chamber is greater than or equal to 10 atm.

In still various other embodiments, the method further includes transferring the carbon monoxide and carbon dioxide into a base bath, wherein the base bath absorbs the carbon dioxide.

In still various other embodiments, the base bath includes sodium hydroxide.

In still various other embodiments, the method further includes reusing the transferred carbon monoxide through the first inlet and/or the second inlet.

In still various other embodiments, the substrate includes a membrane filter.

In still various other embodiments, the membrane filter includes polyethylene terephthalate.

In still various other embodiments, the substrate is stored on a roll-to-roll system.

In still various other embodiments, the catalyst precursor includes penta(carbonyl)iron.

In still various other embodiments, supplying the carrier carbon monoxide and catalyst precursor is performed at room temperature.

In still various other embodiments, exposing the substrate to the composite aerosol deposits the SWCNT film onto the filter membrane while passing the carbon monoxide and carbon dioxide through the filter membrane.

Further, various embodiments are directed to an apparatus for producing single-walled carbon nanotubes including:
a reaction chamber;
a mixing zone connected to the reaction chamber;
a first inlet configured to feed room temperature carrier carbon monoxide gas and catalyst precursor to the mixing zone;
a second inlet configured to receive carbon monoxide gas;
a piping connected to the second inlet, wherein the piping feeds the carbon monoxide gas into the mixing zone;
a heat source in thermal connection with the piping and configured to heat the carbon monoxide gas fed through the piping and into the mixing zone, wherein the carrier carbon monoxide gas and the catalyst precursor is configured to be mixed with the heated carbon monoxide gas and reacts to form an aerosol containing single-walled carbon nanotubes (SWCNTs);
a deposition chamber connected to the reaction chamber through a transfer piping; and
a substrate holder configured to hold a substrate in position to expose a surface of the substrate to the aerosol depositing a SWCNT film on the surface of the substrate.

In various other embodiments, the substrate includes a membrane filter.

In still various other embodiments, the membrane filter comprises polyethylene terephthalate.

In still various other embodiments, the substrate includes a flexible membrane filter.

In still various other embodiments, the substrate holder comprises: a first roller configured to hold a first roll of unused flexible substrate, wherein the first roll is configured to feed unused flexible substrate in the path of the aerosol containing large diameter SWCNTs; and a second roll configured to store flexible substrate which has been deposited with the SWCNT film.

In still various other embodiments, the aerosol further contains carbon monoxide and carbon dioxide, and wherein the membrane filter is configured to filter the large diameter SWCNTs out of the aerosol while passing the carbon monoxide and the carbon dioxide.

Further, various embodiments are directed to a transparent electrode film, including: a substrate; and a single-walled carbon nanotube film deposited on a surface of the substrate, wherein the single-walled carbon nanotube film has a low

4

FIG. 7 illustrates a process for depositing large diameter single-walled carbon nanotube films in accordance with an embodiment of the invention.

DETAILED DESCRIPTION

While considerable research towards identification of alternative materials or structures for OLED anodes has been completed to date, there appears to be only limited success. A comparative table (Table 1) summarizes the key considerations when evaluating a transparent anode specifically for OLED lighting application. Under the equivalent transmittance, their sheet resistances are about 3~6 times higher than that of ITO. Silver nanowire (Ag NW) networks exhibit equivalent or better figures of merit such as broad sheet resistances from $10\Omega/\square$ to $300\Omega/\square$, high transmittance >90%, and low surface coverage (1%).

TABLE 1

| Key parameters of various transparent conductors targeted for OLED lighting. | | | | | | | |
|---|---|---|---|---|---|---|---|
| Transparent conductor | Sheet resistance (Ohm/sq) | Surface roughness | Mechanical strength | Form factor | Light extraction | Solution processing | Production cost |
| Glass/ITO | 10~15 | Low | High | Rigid | Low | No | High |
| PET/ITO | 50~200 | Medium | Medium | Flexible | Low | No | High |
| PEDOT:PSS | 30~500 | Low | Low | Flexible | Low | Yes | Medium |
| CNT | >200 | Medium | Low | Flexible | Low | Yes | Medium |
| Graphene | >50 | Low | Low | Flexible | Low | No | High |
| Metal grid | <10 | High | Low | Flexible | Medium | Maybe | Medium |
| AgNW | <10 | High | Low | Flexible | Medium | Yes | Medium |
| Highly Conductive SWCNTs | <40 | Low | High | Flexible | High | Yes | Low | sheet resistance, high transparency, and surface roughness, wherein the single walled carbon nanotube film has a high level of entanglement.

BRIEF DESCRIPTION OF THE DRAWINGS

The description will be more fully understood with reference to the following figures and data graphs, which are presented as exemplary embodiments of the invention and should not be construed as a complete recitation of the scope of the invention.

Figure 1:
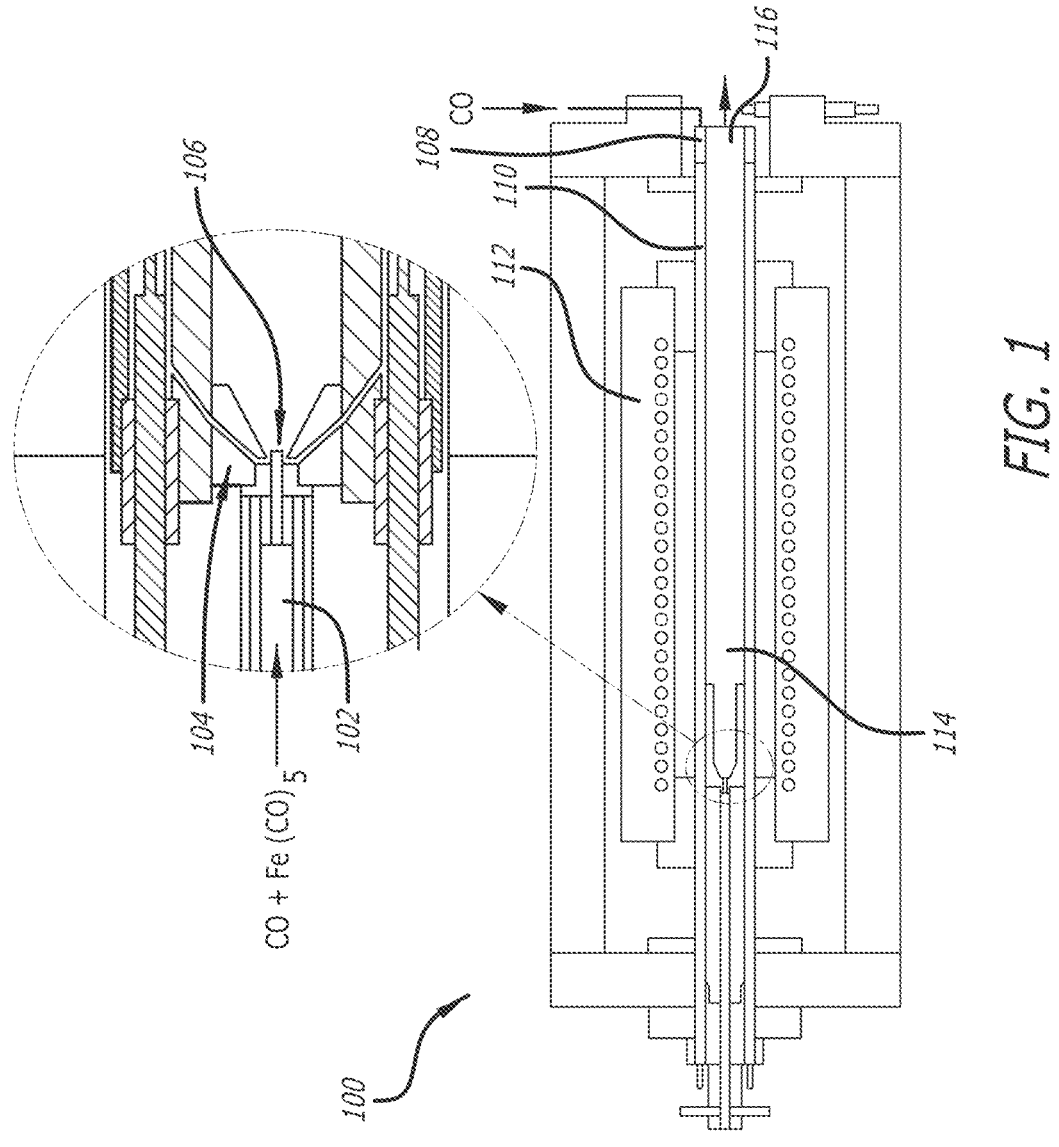
FIG. 1 illustrates an apparatus which performs high pressure carbon monoxide conversion for production of large diameter single-walled carbon nanotubes in accordance with an embodiment of the invention.

Ag NW networks have been investigated as a potential ITO replacement, as Ag NW networks can reproduce the high surface conductivity and visual transparency of ITO. To achieve the performance metrics, the integrated Ag NWs electrodes have been heavily investigated as a new electrode material to replace ITO. R&D of these alternative electrode materials have progressed in recent years, with commercial viability evidenced by large-area coatings of Ag NWs on glass and plastic substrates, primarily entering the marketplace as flexible Ag NW networks as transparent conductive films for touch sensors. However, while application of the Ag NW networks as electrodes presents some beneficial results such as high conductivity and transparency and low surface roughness, Ag NW networks may ultimately not be suitable for use as electrodes due to low adhesion of nanowires to the substrate and low thermal and electrical stability of nanosized silver.

Disadvantageously, the overall requirements of Ag NWs flexible/bendable anode used in OLED applications are highly stringent as even minuscule defects will result in detrimental impact to device performance. As an example, localized protruding nanowires with height elevations at just tens of nanometers, which is nearly the thickness of the most organic layers in OLEDs, will indisputably cause current leakages. Though smoothening techniques have been investigated, further improvement is still necessary for high performing, long lifetime OLEDs. Furthermore, while the stability of silver is often cited as a critical issue for Ag NWs, it has not been adequately addressed by companies developing Ag NWs based integrated substrates.

To address these above-described issues, high-index colorless polymer embedded single-walled carbon nanotube (SWCNT) films have been developed for high conductivity, high transparency, operation stability, mechanical endurance. Advantageously, large diameter SWCNTs have been discovered to have improved high conductivity without sacrificing transparency. The sheet resistance of current transparent conductive SWCNTs films is around 40 Ohms/square. With appropriate doping, their sheet resistance can be further drop down to below 20 Ohms/square. Moreover, through processes such as roll-to-roll processes, these transparent conductive SWCNTs thin films can be produced in large scale and high throughput. High pressure carbon monoxide conversion reactions may be used to increase production of high quality large diameter SWCNTs with low cost. SWCNTs can also act as thermal conductors for heat dissipation and electrode skeletons for mechanical endurance.

A reliable low-cost polymer embedded high conductivity transparent SWCNTs have been developed. These SWCNTs may be used for a flexible anode for OLED lighting. The SWCNTs may be manufactured through sheet-to-sheet iteration which may optimize the processing parameters. Implementing an established protocol toward high-throughput coating strategy and provide relevant manufacturing standards may help produce high quality electrodes. The fabricated polymer embedded high conductivity transparent SWCNTs flexible electrodes may be characterized for performance metrics such as electrical conductivity, photo transparency, mechanical endurance, thermal conductivity, surface roughness, operation stability, light extraction efficiency, scalability, cost, and challenges. Furthermore, the polymer supported/embedded high conductivity transparent SWCNTs flexible substrates may be integrated into OLED lighting panels and luminaires.

There is high demand for flexible and slim luminaires which are designed and demonstrated to cover various applications such as general lighting in building, hospitals, and military facilities. The developed polymer embedded high conductivity transparent SWCNTs flexible anode may be useful for these applications. In some embodiments, the developed polymer embedded high conductivity transparent SWCNTs flexible anode may as well be integrated in OLED devices used in decorative lighting. Flexible form factors of OLED may allow for more freedom in designing complex patterns and for integration of lighting on uneven surfaces. In some embodiments, the developed polymer embedded high conductivity transparent SWCNTs flexible electrodes may be integrated into touch panels, transparent and flexible electronics, and medical devices.

High Pressure Carbon Monoxide Conversion for Production of Large Diameter SWCNTs As discussed previously, high pressure carbon monoxide conversion may be used to produce large diameter SWCNTs which may be advantageously used as high quality transparent conductive material. FIG. 1 illustrates an apparatus 100 which performs high pressure carbon monoxide conversion according to embodiments of the invention. The apparatus 100 is configured to perform thermal decomposition of a catalyst precursor through a flow of carbon monoxide (CO). In some embodiments, the catalyst precursor is iron pentacarbonyl (Fe(CO)$_5$; penta(carbonyl)iron).

The apparatus 100 includes an injection inlet 102 where the catalyst precursor and carrier CO may be injected. The catalyst precursor and carrier CO may be injected at a temperature below the reaction temperature of the catalyst precursor (e.g. room temperature). The apparatus 100 also includes a showerhead 104 which is configured to deliver heated CO to the catalyst precursor and carrier CO. The showerhead 104 may deliver heated CO at a temperature of about 1000° C.-1100° C., about 1010° C.-1090° C., about 1020° C.-1080° C., about 1030° C.-1070° C., or about 1040° C.-1060° C. In some embodiments, the showerhead 104 may deliver heated CO at a temperature of about 1050° C. The injection inlet 102 and the showerhead 104 delivers their vapor phase substance into a mixing zone 106 where the catalyst precursor and carrier CO mix with the heated CO. The heated CO heats the catalyst precursor which reacts with the CO. In some embodiments, the apparatus 100 comprises at least a first inlet 102 such as an injection inlet and a second inlet 108 such as a CO inlet.

The showerhead 104 may be connected to a CO inlet 108 where CO may flow through piping 110. In some embodiments, the piping 110 is stainless steel tubes. In some embodiments, the piping 110 may be channels bored in tube walls. The piping 110 may be in thermal contact with heating elements 112 which may be positioned radially outward from the piping 110. While the vapor phase CO flows through the piping 110, the heating elements 112 may heat the CO creating heated. After the catalyst precursor and the carrier CO mix with the heated CO in the mixing zone 106, the mixed vapor phase substance flows through a reaction chamber 114 where thermal decomposition of iron pentacarbonyl takes place to produce carbon nanotubes. The mixing zone 106 and reaction chamber 114 are kept a high pressure due to the flow of gases from the injection inlet 102 and the showerhead 104. In some embodiments, the pressure of the mixing zone 106 and/or the reaction chamber 114 may be 10 atm or higher.

The high pressure and high temperature in the reaction chamber 114 simultaneously decompose the penta(carbonyl) iron to form iron nanoparticles with diameter in the range of about 0.6 nm-9 nm or about 2 nm-9 nm. Around these iron nanoparticles, carbon monoxides undergo self-redox reaction to form carbon nanotubes and carbon dioxide. An example of this process is illustrated in Equation 1:

$$2CO(g) \xrightarrow{Fe(CO)_5} C(s) + CO2(g)$$

In Equation 1, the CO gas reduces to solid carbon and carbon dioxide gas. The solid carbon forms the carbon nanotubes. The reaction may form an in situ synthesized aerosol which may include SWCNTs, metal nanoparticles (e.g. iron nanoparticles), carbon monoxide, and carbon dioxide. The SWCNTs which flows from the reaction chamber 114 through the outlet 116. The formed aerosol including SWCNTs may pass onto one or more substrates which may deposit the SWCNTs and form uniform and consistent high conductivity SWCNTs thin films on the one or more substrates.

Carbon monoxide and carbon dioxide may be pumped back to the reactor as the carbon source again. The carbon monoxide and carbon dioxide may be exposed to a base bath which may include sodium hydroxide. The carbon dioxide may be absorbed by sodium hydroxide to form sodium carbonate which may filter out the carbon dioxide thus leaving only carbon monoxide to be reused.

Figure 2:
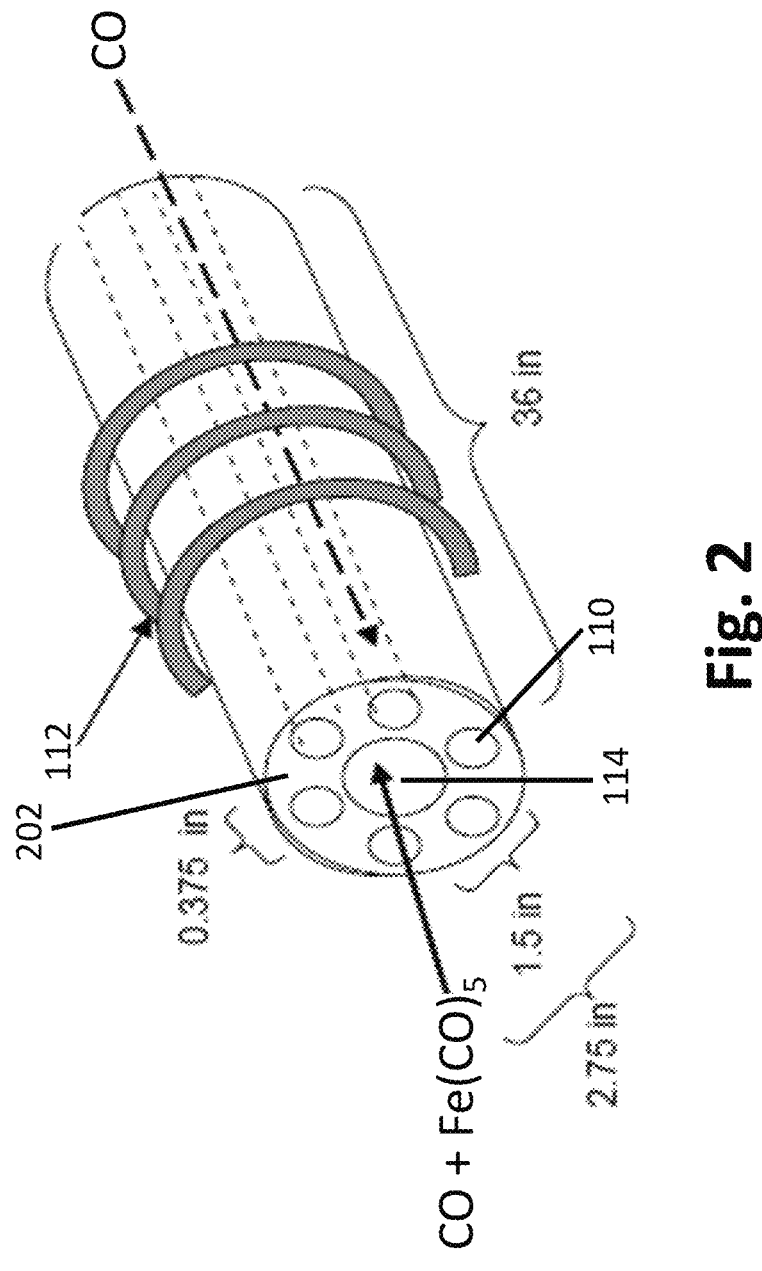
FIG. 2 illustrates a diagram of the apparatus described in FIG. 1.

FIG. 2 illustrates a diagram of the apparatus 100 described in connection with FIG. 1. FIG. 2 shows various example dimensions of the apparatus 100. As illustrated, the piping 110 may be channels bored in a tube wall 202. The tube wall 202 may surround the reaction chamber 114. The reaction chamber 114 may be 1.5 inches in diameter. The diameter of the whole tube wall 202 surrounding the reaction chamber 114 may be 2.75 inches. The diameter of each of the piping 110 may be 0.375 inches. The length of the reaction chamber from before the showerhead (shown in FIG. 1) to the outlet 116 may be 36 inches. These dimensions are exemplary and other dimensions have been contemplated for other applications.

Carbon monoxide and catalyst precursor feeding rates may be adjusted to produce large diameter SWCNTs. In some embodiments, the carrier CO and catalyst precursor may in-situ form an aerosol which flows through the injector 102. The in-situ formed SWCNTs aerosol may be deposited onto substrates to form high conductivity transparent SWCNTs thin films on the substrates. Adjusting reaction conditions produces a polymer embedded high conductivity transparent SWCNTs flexible anode with pre-determined parameters for all materials.

The high pressure carbon monoxide conversion reactor produces large diameter SWCNTs. In some embodiments, the diameter of the large diameter SWCNTs is greater than 2 nm. The in-situ synthesized SWCNTs aerosol may be deposited on one or more substrates to form high conductivity transparent SWCNTs thin films. In some embodiments, the sheet resistance of the resultant large diameter SWCNT film is less than 40 Ohms/Square. The remaining gas may be reused as a carbon source after washing with a base bath such as a sodium hydroxide solution.

Figure 3:
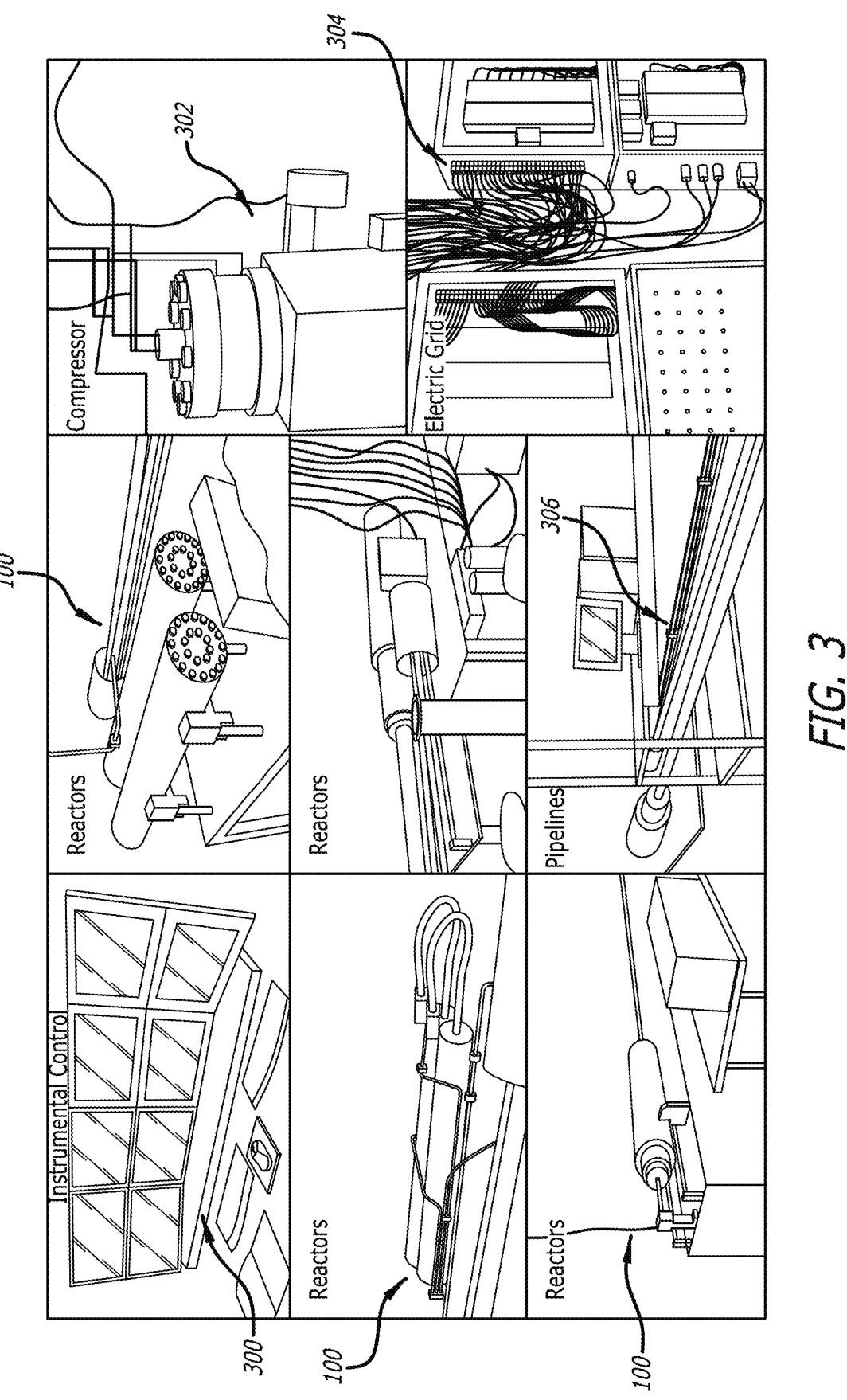
FIG. 3 illustrates an example high pressure carbon monoxide conversion reactor including many apparatus described in FIGS. 1 and 2.

FIG. 3 illustrates an example high pressure carbon monoxide conversion reactor including many embodiments of the apparatus 100 discussed in connection with FIGS. 1 and 2. The high pressure carbon monoxide reactor including one or more apparatuses 100, one or more control panels 300, one or more compressors 302, one or more electrical suppliers 304 and one or more gas pipelines 306. These components may be connected either electrically or physically (e.g. fluid or gaseous connection). For example, the one or more control panels 300 may be connected to one or more gas supplies connected to the gas pipelines 306 to control the supply of various gases. In some implementations, the control panels 300 may include a processor and memory which may be used to adjust the reaction feeding rates, feeding ratio, pressure, and temperature of each of the apparatus 100 to achieve large diameter SWCNTs.

Figure 4:
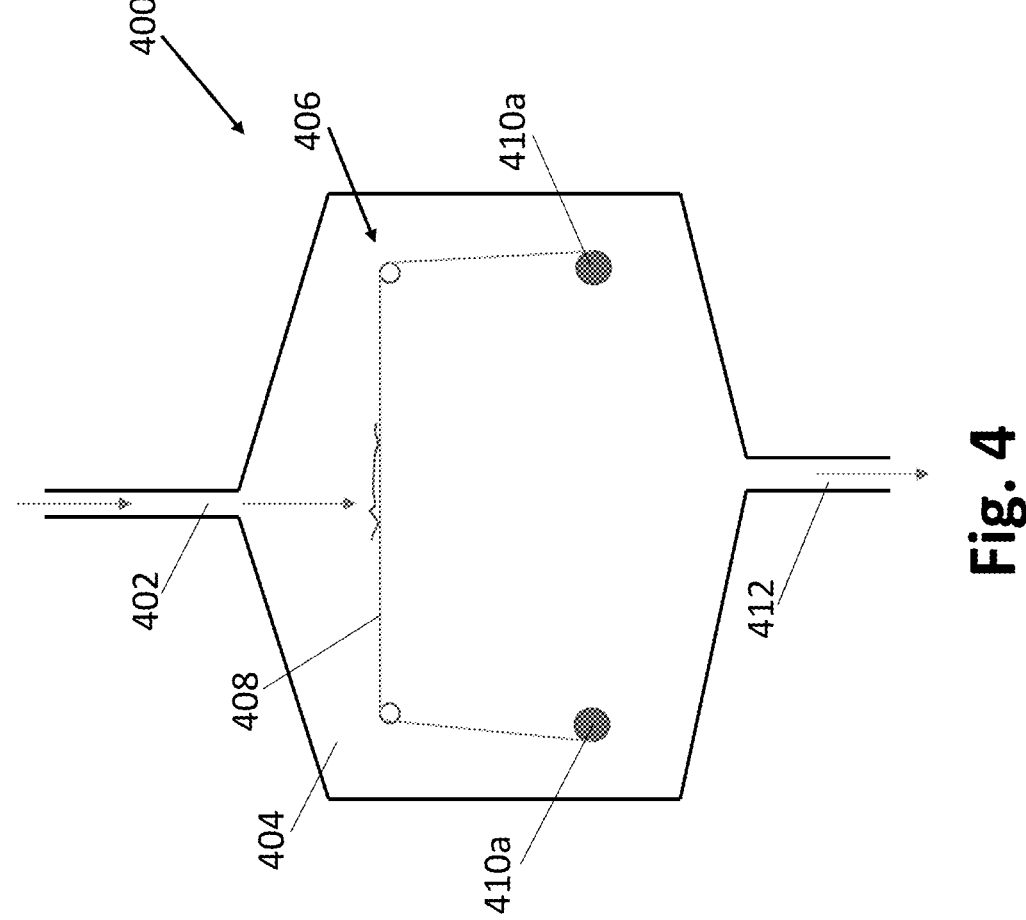
FIG. 4 is a schematic representation of a deposition system connected to the apparatus described in FIGS. 1 and 2 in accordance with an embodiment of the invention.

FIG. 4 is schematic of a deposition system 400 connected to the apparatus 100 discussed in connection with FIGS. 1 and 2 in accordance with an embodiment of the invention. The deposition system 400 connects the apparatus 100 to a deposition chamber 404 through piping 402. The deposition chamber 404 may house a roll to roll deposition system 406 which includes a substrate 408. The piping 402 sprays the aerosol containing SWCNTs 402 onto the substrate 408 where the SWCNTs are left as a SWCNT film onto the substrate 408. The roll to roll deposition system 406 may include a fresh substrate roller 410a and a deposited substrate roller 410b. While the piping 402 the SWCNTs are left on a portion of the substrate 408, the substrate 408 is continually refreshed through rolling fresh substrate 408 to replace deposited upon substrate 408. While the positioning of the fresh substrate roller 410a and the deposited substrate roller 410b are illustrated in a certain orientation, it is understood that these rollers could be reversed where the direction would be reversed. The movement rate of the substrate 408 may be controlled in combination with the feeding rates of the apparatus 100 to achieve a certain film thickness to achieve a balance of conductivity and transparency of SWCNT thin films.

In some embodiments, the substrate 408 may be a membrane filter such as a polyethylene terephthalate (PET; poly(ethylene terephthalate)) or other suitable material capable of trapping SWCNTs 402 and passing through other portions of the aerosol. Advantageously, membrane filters allow better flow through the chamber which would aid in deposition. The substrate 408 may also be a flexible substrate. In some embodiments, the deposition system may be a single substrate system instead of a roll to roll system where a single substrate is placed within the system and SWCNTs are deposited onto the substrate. In these systems, the substrate may be a flexible or rigid substrate. In some embodiments, the deposition system may be a batch processing system capable of depositing on multiple substrates in one chamber. The deposition system 400 further includes a gas outlet 412 which is connected to the deposition chamber 404 where the gases which have been filtered may exit.

Example Large Diameter SWCNT Films

Figure 5B:
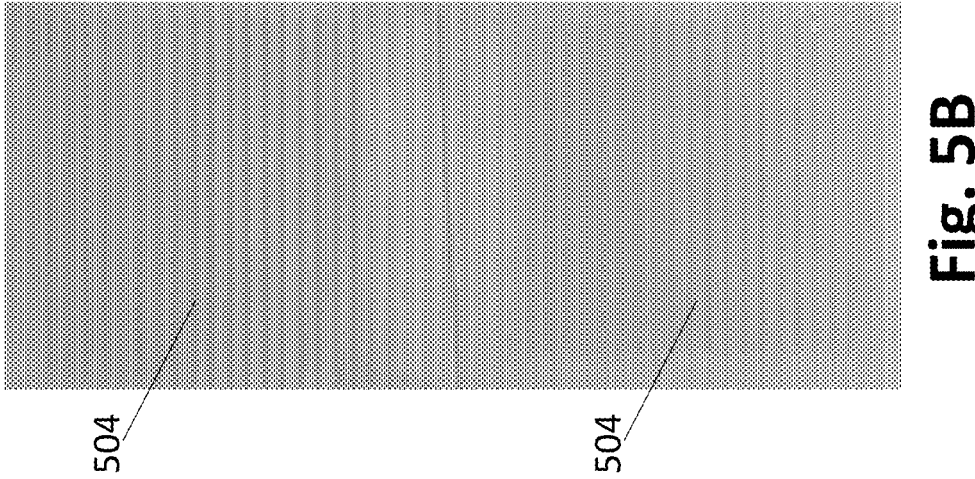
FIGS. 5A and 5B illustrate examples of films including large diameter single-walled carbon nanotube films in accordance with an embodiment of the invention.
Figure 5A:
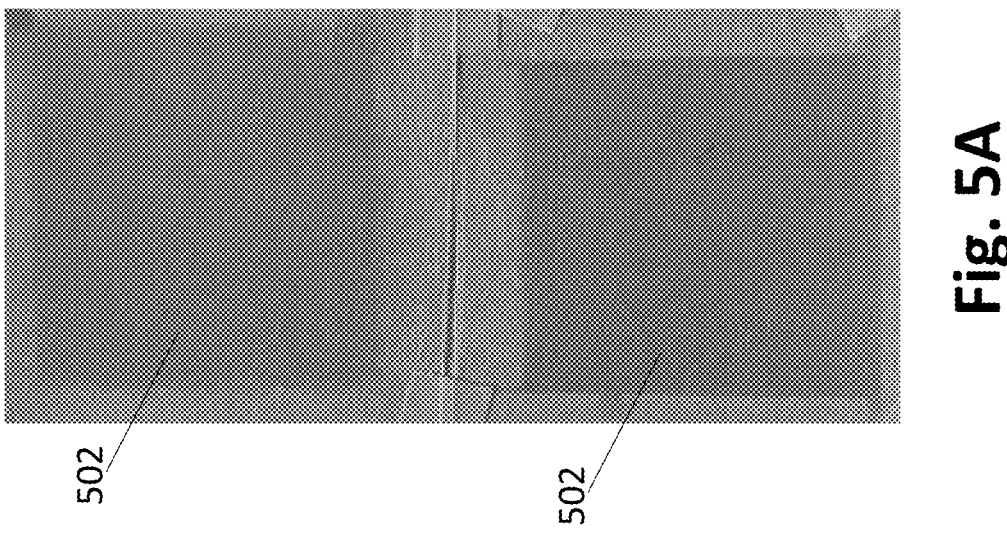

FIGS. 5A and 5B illustrate examples of films including large diameter SWCNT films deposited with the methods and apparatuses described above. FIG. 5A illustrates example large diameter SWCNT films 502 on PET which do not undergo post processing treatment. These films 502 have a sheet resistance of about 200-300 $\Omega$/square. FIG. 5B illustrates example large diameter SWCNT films 504 on PET which undergo post processing treatment. The post processing treatment may include an acid treatment or an oxidation process. The acid treatment may include exposing the deposited SWCNT films 504 to an acid such as chloroauric acid ($HAuCl_4$) or nitric acid ($HNO_3$). The oxidation process may include an oxidation agent. Post processing treatment may decrease sheet resistance and thus increase conductivity. In some instances, the post treated films 504 may have a sheet resistance of about 40 $\Omega$/square or lower. When the post processing treatment includes chloroauric acid, the SWCNT films 504 may be doped with $AuCl_3$. The post processing treatment may decrease transparency and thus post processing treatments may tradeoff conductivity with transparency. The post processing treatment may make the SWCNT films 504 more conductive and suitable for use as electrodes.

Figure 6B:
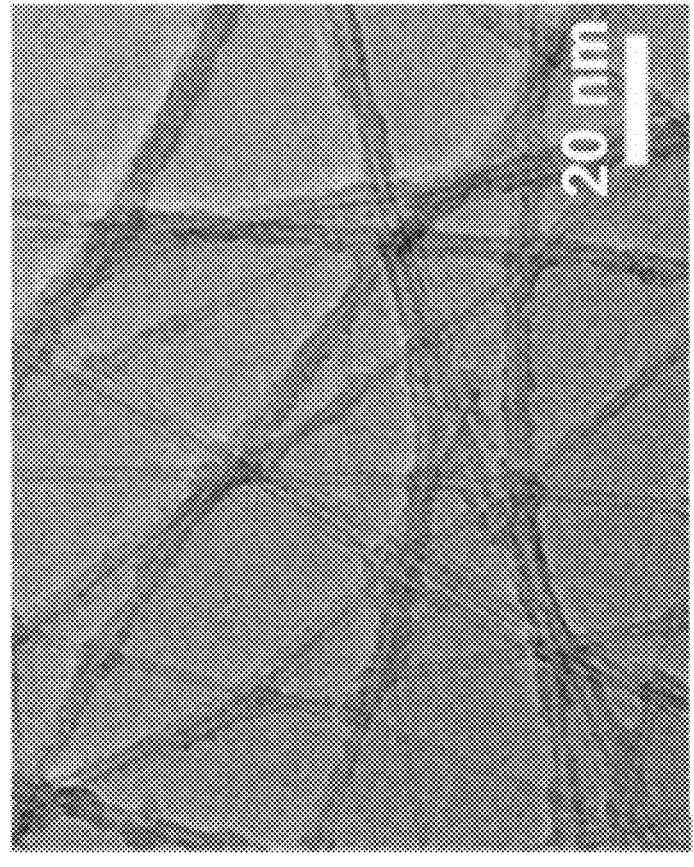
FIG. 6B is a tunneling electron microscope image of a large diameter single-walled carbon nanotube film in accordance with an embodiment of the invention.
Figure 6A:
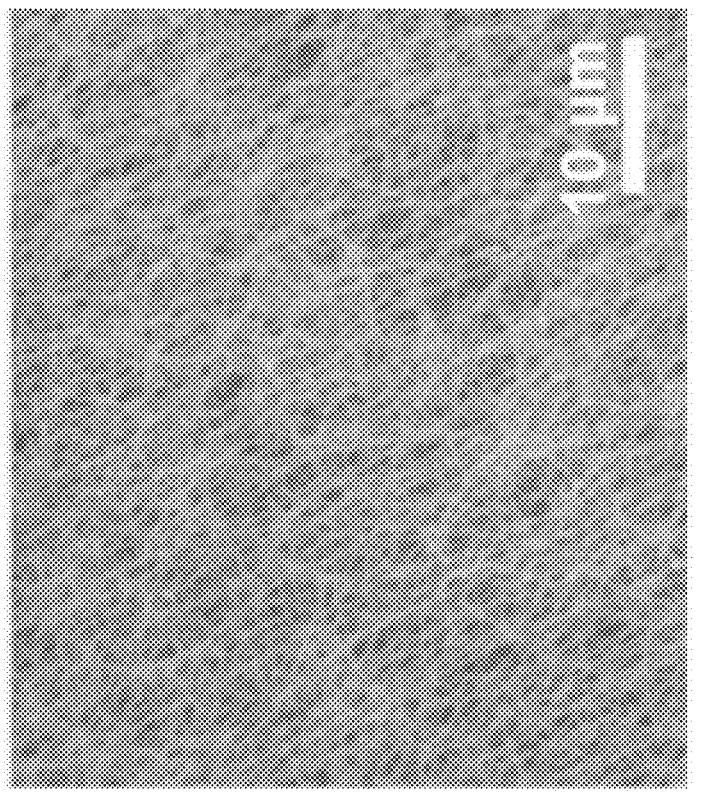
FIG. 6A is a scanning electron microscope image of a large diameter single-walled carbon nanotube film in accordance with an embodiment of the invention.

FIG. 6A is a scanning electron microscope image of a large diameter SWCNT films which have been deposited in accordance with an embodiment of the invention. FIG. 6B is a transmission electron microscope image of a large diameter SWCNT films which have been deposited in accordance with an embodiment of the invention. Adjustment of the reaction discussed above may increase the diameter of the SWCNTs, improve conductivity of the films, and increase transparency of the films.

It may be beneficial to have electrodes with low surface roughness. The surface roughness of polymer embedded SWCNTs flexible electrodes may be subject to the diameters of SWNCTs, but may also depend upon the supporting substrate surfaces and the adhesion forces between the supporting substrate and components of SWCNTs composites leading to the protruding SWCNTs. Thus, specific supporting substrates may provide superior roughness. In some embodiments, the supporting substrate may be treated with self-assembled small molecules to eliminate the attraction caused defects during the peeling process which separates the polymer embedded SWCNTs from the supporting substrates. In some embodiments, the supporting substrate is post-treated to smooth the fabricated polymer embedded SWCNTs flexible electrodes.

Process for Deposition of Large Diameter SWCNT Films

FIG. 7 illustrates a process for depositing large diameter SWCNT films in accordance with an embodiment of the invention. At block 702, carrier carbon monoxide and catalyst precursor is supplied. The carrier carbon monoxide and catalyst precursor is kept at a temperature below the reaction temperature (e.g. room temperature) of the catalyst precursor and the carrier carbon monoxide. At block 704, heated carbon monoxide is supplied to the carrier carbon monoxide and the catalyst precursor.

At block 706, the heated carbon monoxide and the carrier carbon monoxide and catalyst precursor mix together. The heated carbon monoxide heats the catalyst precursor which causes a reaction which forms an aerosol containing larger diameter SWCNTs. In some embodiments, the aerosol may include single-walled carbon nanotubes, metal nanoparticles, carbon monoxide, and carbon dioxide.

At block 708, a substrate is exposed to the aerosol to deposit a carbon nanotube film on a surface of a substrate. In some embodiments, the substrate may be a membrane filter such as a PET film. The membrane filter may deposit the carbon nanotubes onto the membrane filter while passing through the remaining components of the aerosol.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A method of producing single-walled carbon nanotubes, the method comprising:
   supplying, to a mixing zone, a carrier carbon monoxide and a catalyst precursor through a first inlet at a temperature below the reaction temperature of the catalyst precursor;
   supplying, to a mixing zone, a heated carbon monoxide through a second inlet such that the heated carbon monoxide mixes with the carrier carbon monoxide and the catalyst to form an aerosol;
   reacting the aerosol in a reaction chamber to form a composite aerosol comprising single-walled carbon nanotubes (SWCNTs), carbon monoxide, and carbon dioxide;
   exposing a substrate to the composite aerosol to deposit a SWCNT film on a surface of the substrate, wherein the substrate is stored on a roll-to-roll system, and wherein the substrate comprises a flexible membrane filter;
   feeding an unused flexible membrane substrate into the path of the composite aerosol comprising SWCNTs on a first roller as a SWCNT film; and
   storing the flexible membrane substrate which has been deposited with the SWCNT film on a second roller.

2. The method of claim 1, wherein the second inlet comprises a showerhead.

3. The method of claim 1, wherein the heated carbon monoxide is at a temperature of 1000° C.-1100° C.

4. The method of claim 1, wherein the pressure within the reaction chamber is greater than or equal to 10 atm.

5. The method of claim 1, transferring the carbon monoxide and carbon dioxide into a base bath, wherein the base bath absorbs the carbon dioxide.

6. The method of claim 5, wherein the base bath comprises sodium hydroxide.

7. The method of claim 5, further comprising reusing the transferred carbon monoxide through the first inlet and/or the second inlet.

8. The method of claim 1, wherein the substrate comprises a membrane filter.

9. The method of claim 8, wherein the membrane filter comprises polyethylene terephthalate.

10. The method of claim 8, wherein exposing the substrate to the composite aerosol deposits the SWCNT film onto the filter membrane while passing the carbon monoxide and carbon dioxide through the filter membrane.

11. The method of claim 1, wherein the catalyst precursor comprises penta(carbonyl)iron.

12. An apparatus for producing single-walled carbon nanotubes comprising:
   a reaction chamber;
   a mixing zone connected to the reaction chamber;
   a first inlet configured to feed a carrier carbon monoxide gas and a catalyst precursor to the mixing zone;
   a second inlet configured to couple to a carbon monoxide gas source, and receive carbon monoxide gas from the carbon monoxide gas source;
   a piping connected to the second inlet, wherein the piping feeds the carbon monoxide gas into the mixing zone;
   a heat source in thermal connection with the piping and configured to heat the carbon monoxide gas fed through the piping and into the mixing zone, wherein the carrier carbon monoxide gas and the catalyst precursor is configured to be mixed with the heated carbon monoxide gas and reacts to form an aerosol containing single-walled carbon nanotubes (SWCNTs);
   a deposition chamber connected to the reaction chamber through a transfer piping; and
   a substrate holder configured to hold a substrate in position to expose a surface of the substrate to the aerosol depositing a SWCNT film on the surface of the substrate, wherein the substrate comprises a flexible membrane filter, and wherein the substrate holder comprises:
      a first roller configured to hold a first roll of an unused flexible substrate wherein the first roll is configured to feed the unused flexible substrate in the path of the aerosol comprising SWCNTs; and
      a second roll configured to store the flexible membrane substrate which has been deposited with the SWCNT film.

13. The apparatus of claim 12, wherein the membrane filter comprises polyethylene terephthalate.

14. The apparatus of claim 12, wherein the aerosol further contains carbon monoxide and carbon dioxide, and wherein the flexible membrane filter is configured to filter the SWCNTs out of the aerosol while passing the carbon monoxide and the carbon dioxide.

* * * * *